(12) United States Patent
Okatake et al.

(10) Patent No.: US 11,946,987 B2
(45) Date of Patent: *Apr. 2, 2024

(54) HALL ELECTROMOTIVE FORCE SIGNAL DETECTION CIRCUIT HAVING A DIFFERENCE CALCULATION CIRCUIT AND CURRENT SENSOR THEREOF

(71) Applicant: ASAHI KASEI MICRODEVICES CORPORATION, Tokyo (JP)

(72) Inventors: Shigeki Okatake, Tokyo (JP); Takenobu Nakamura, Tokyo (JP)

(73) Assignee: Asahi Kasei Microdevices Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/939,107

(22) Filed: Sep. 7, 2022

(65) Prior Publication Data

US 2023/0017847 A1 Jan. 19, 2023

Related U.S. Application Data

(60) Continuation of application No. 17/200,515, filed on Mar. 12, 2021, now Pat. No. 11,493,569, which is a (Continued)

(30) Foreign Application Priority Data

Jan. 25, 2012 (JP) ................................ 2012-012774

(51) Int. Cl.
*G01R 33/07* (2006.01)
*G01R 15/20* (2006.01)
(Continued)

(52) U.S. Cl.
CPC ......... *G01R 33/075* (2013.01); *G01R 15/202* (2013.01); *G01R 19/0092* (2013.01);
(Continued)

(58) Field of Classification Search
CPC ............ G01R 33/0041; G01R 33/0023; G01R 33/07; G01R 33/072; G01R 33/075;
(Continued)

(56) References Cited

U.S. PATENT DOCUMENTS 5,844,427 A  12/1998 Theus et al.
6,064,202 A   5/2000 Steiner et al.
(Continued)

FOREIGN PATENT DOCUMENTS

JP  2004-069466 A  3/2004
JP  2007-525680 A  9/2007
(Continued)

OTHER PUBLICATIONS

Popovic, Hall Effect Devices Magnetic Sensors and Characterization of Semiconductors, Inst of Physics Pub Inc (May 1991) (ISBN-10:0750300965).

(Continued)

*Primary Examiner* — David M Schindler
(74) *Attorney, Agent, or Firm* — Morgan, Lewis & Bockius LLP

(57) ABSTRACT

The present invention relates to a hall electromotive force signal detection circuit and a current sensor thereof each of which is able to achieve excellent wide-band characteristics and fast response as well as high accuracy. A difference calculation circuit samples a component synchronous with a chopper clock generated by a chopper clock generation circuit, out of an output voltage signal of a signal amplifier circuit, at a timing obtained from the chopper clock, so as to detect the component. An integrating circuit integrates an output from the difference calculation circuit in the time domain. An output voltage signal from the integrating circuit is fed back to a signal amplifier circuit via a third transconductance element.

6 Claims, 15 Drawing Sheets

Related U.S. Application Data continuation of application No. 15/250,398, filed on Aug. 29, 2016, now Pat. No. 10,976,384, which is a division of application No. 14/127,280, filed as application No. PCT/JP2013/000065 on Jan. 10, 2013, now abandoned.

(51) Int. Cl.
  *G01R 19/00* (2006.01)
  *G01R 33/00* (2006.01)

(52) U.S. Cl.
  CPC ..... *G01R 33/0023* (2013.01); *G01R 33/0029* (2013.01); *G01R 33/0035* (2013.01); *G01R 33/0041* (2013.01); *G01R 33/07* (2013.01); *G01R 33/072* (2013.01)

(58) Field of Classification Search
  CPC .... G01R 33/077; G01R 33/09; G01R 33/091; G01R 33/093; G01R 33/095; G01R 33/096; G01R 33/098; G01R 19/0092; G01R 15/20; G01R 15/202; G01R 15/205; G01R 33/0094; G01R 33/0029; G01R 33/0035; G01D 5/14; G01D 5/142; G01D 5/145; G01D 5/147; G01D 5/16; G01D 5/20; G01D 5/2006; G01D 5/2013; G01D 5/202; G01D 5/2026; G01D 5/2033; G01D 5/204; G01D 5/2046; G01D 5/2053; G01D 5/206; G01D 5/22; G01D 5/2208; G01D 5/2216; G01D 5/2225; G01D 5/2233; G01D 5/2241; G01D 5/225; G01D 5/2258; G01D 5/2266; G01D 5/2275; G01D 5/2283; G01B 7/02; G01B 7/023; G01B 7/04; G01B 7/046; G01B 7/14; G01B 7/305; G01B 7/31; G01B 7/312; G01B 7/30; H01L 43/00; H01L 43/06; H01L 43/08; H03M 3/376; H03M 3/34; H03F 3/387; H03F 3/393; H03F 3/45968; H03F 3/45973; H03F 2200/273; H03F 2200/261
  See application file for complete search history.

(56) References Cited

U.S. PATENT DOCUMENTS

| | | | |
|---|---|---|---|
| 6,118,399 A | 9/2000 | Krone | |
| 6,154,027 A | 11/2000 | Alexander et al. | |
| 6,362,618 B1 | 3/2002 | Motz | |
| 6,433,544 B1 | 8/2002 | Motz | |
| 6,674,322 B2 | 1/2004 | Motz | |
| 7,764,118 B2 | 7/2010 | Kusuda et al. | |
| 10,976,384 B2 | 4/2021 | Okatake et al. | |
| 2002/0149506 A1 | 10/2002 | Altrichter et al. | |
| 2003/0102909 A1 | 6/2003 | Motz | |
| 2003/0225539 A1 | 12/2003 | Motz et al. | |
| 2005/0127899 A1 | 6/2005 | Kakuta et al. | |
| 2005/0258840 A1* | 11/2005 | Ausserlechner | G01R 33/075 324/706 |
| 2005/0275575 A1 | 12/2005 | Motz | |
| 2007/0114988 A1 | 5/2007 | Rossmann et al. | |
| 2007/0247141 A1 | 10/2007 | Pastre et al. | |
| 2008/0094055 A1 | 4/2008 | Monreal et al. | |
| 2008/0094057 A1 | 4/2008 | Ashe | |
| 2008/0238410 A1 | 10/2008 | Charlier et al. | |
| 2009/0009164 A1 | 1/2009 | Utsuno | |
| 2009/0174401 A1* | 7/2009 | Takeda | G01R 33/072 324/251 |
| 2011/0199132 A1* | 8/2011 | Motz | G01R 15/202 327/124 |
| 2011/0215955 A1 | 9/2011 | Motz et al. | |
| 2012/0299588 A1 | 11/2012 | Petrie | |

FOREIGN PATENT DOCUMENTS

| | | |
|---|---|---|
| JP | 2008-513762 A | 5/2008 |
| JP | 2008-309626 A | 12/2008 |
| JP | 2010-507095 A | 3/2010 |
| JP | 2011-163928 A | 8/2011 |
| JP | 2011-169811 A | 9/2011 |

OTHER PUBLICATIONS

Bilotti, Monolithic Magnetic Hall Sensor Using Dynamic Quadrature Offset Cancellation, IEEE Journal of Solid-State Circuits, vol. 32, No. 6, pp. 829-836, Jun. 1997.

Burt, A Micropower Chopper-Stabilized Operational Amplifier Using a SC Notch Filter With Synchronous Integration Inside the Continuous-Time Signal Path, IEEE Journal Of Solid-State Circuits, vol. 41, No. 12, pp. 2729-2736, Dec. 2006.

Wu, A Chopper Current-Feedback Instrumentation Amplifier With a 1 mHz 1/f Noise Corner and an AC-Coupled Ripple Reduction Loop, IEEE Journal of Solid-State Circuits, vol. 44, No. 12, pp. 3232-3243, Dec. 2009.

Motz, A Chopped Hall Sensor With Small Jitter and Programmable "True Power-On" Function, IEEE Journal of Solid- State Circuits, vol. 40, No. 7, pp. 1533-1540, Jul. 2005.

International Search Report dated Apr. 16, 2013 for International application No. PCT/JP2013/000065.

International Preliminary Report on Patentability dated Aug. 7, 2014, for the corresponding International application No. PCT/JP2013/000065.

European Search Report dated Sep. 4, 2015 in corresponding European Patent Application No. 13 74 0979.3.

Demierre, Michel, "Improvements of CMOS Hall Microsystems and Application for Absolute Angular Position Measurements," Institute of Microelectronics and Microsystems, Microsystems Laboratory, Sep. 2003, pp. 1-199.

Uhrmann et al., "Operational Transconductance Amplfiiers (OTAs)," Analog Filters in Nanometer CMOS, pp. 27-38, 16 pages, obtained Jun. 29, 2020. (Year: 2020).

* cited by examiner

CHOPPER CLOCK PHASE IS $\phi 1$ AND DRIVING DIRECTION OF HALL ELEMENT IS 0 DEGREES

CHOPPER CLOCK PHASE IS $\phi 2$ AND DRIVING DIRECTION OF HALL ELEMENT IS 90 DEGREES

DIRECTION OF MAGNETIC FIELD DETECTED BY HALL ELEMENT IS ORTHOGONAL TO PAGE

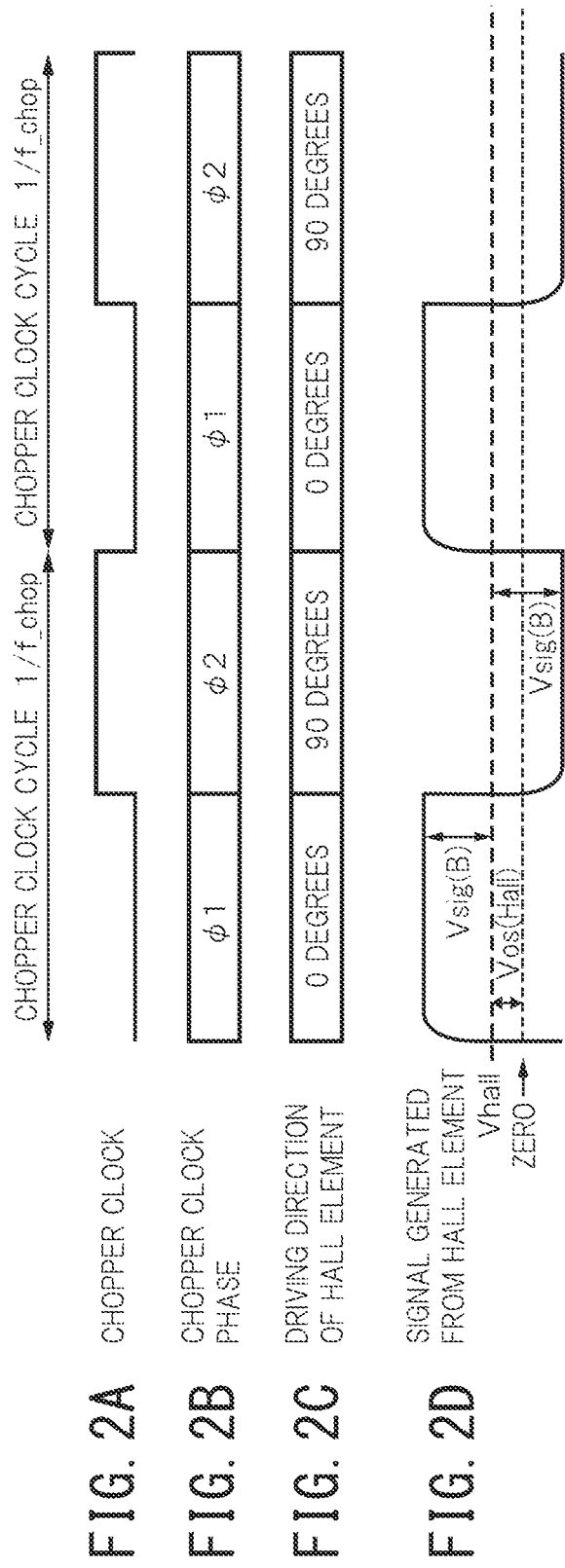

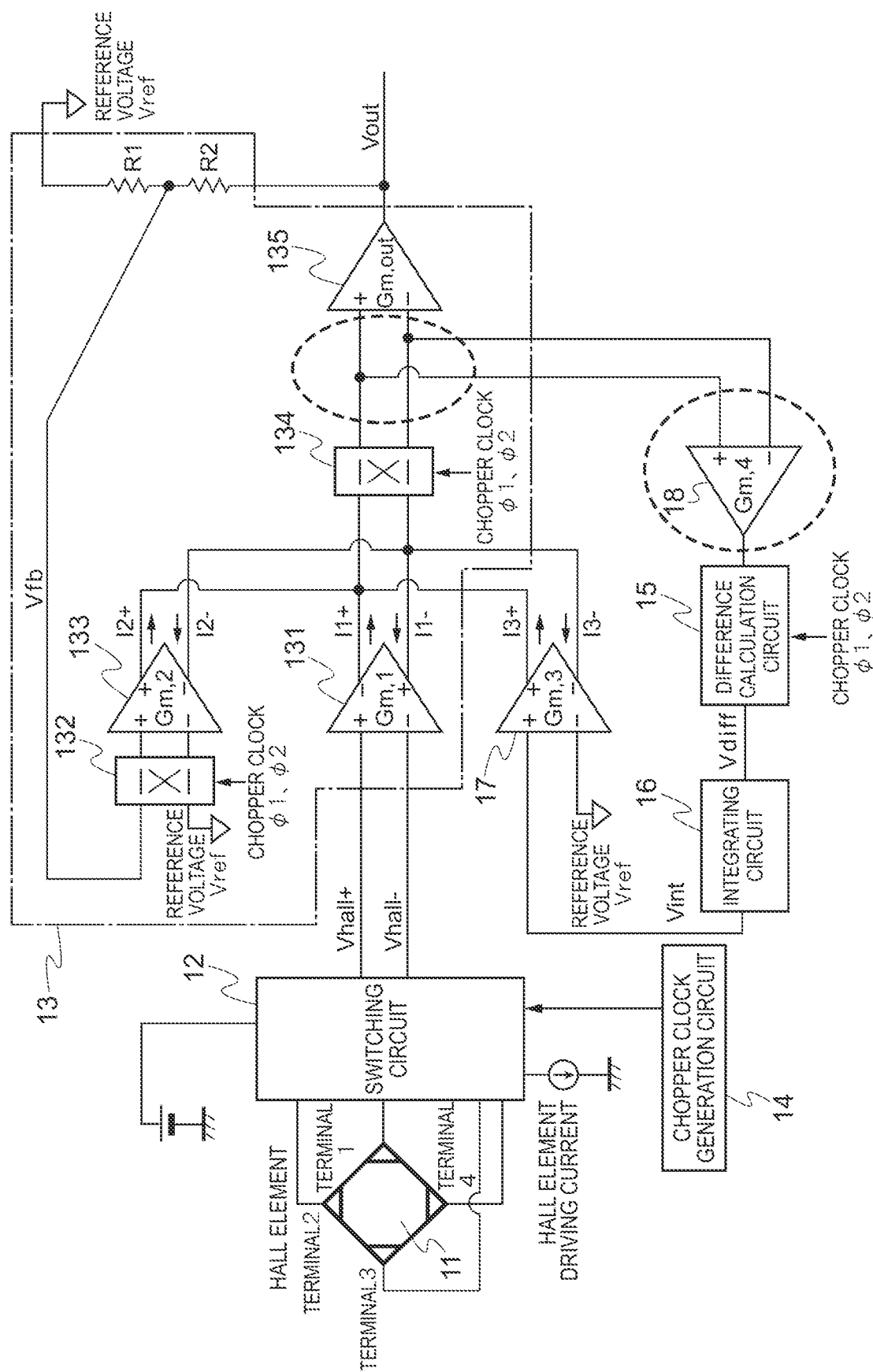

HALL ELECTROMOTIVE FORCE SIGNAL DETECTION CIRCUIT HAVING A DIFFERENCE CALCULATION CIRCUIT AND CURRENT SENSOR THEREOF

CROSS-REFERENCE TO RELATED APPLICATION(S)

This application is a continuation of U.S. patent application Ser. No. 17/200,515, filed on Mar. 12, 2021, which is a continuation of U.S. patent application Ser. No. 15/250,398, filed on Aug. 29, 2016, which is a Divisional of U.S. patent application Ser. No. 14/127,280, filed on Dec. 18, 2013, which is a National Stage Entry of International Patent Application No. PCT/JP2013/000065, filed on Jan. 10, 2013, and claims priority to and the benefit of Japanese Patent Application No. 2012-012774, filed on Jan. 25, 2012, the entirety of each of which is hereby incorporated by reference.

TECHNICAL FIELD

The present invention relates to a hall electromotive force signal detection circuit and a current sensor thereof, and more specifically, to a hall electromotive force signal detection circuit and a current sensor thereof each of which can achieve wide-band characteristics and fast response as well as high accuracy in a magnetic sensor using a hall element, such as a current sensor.

BACKGROUND ART

A magnetic sensor using a hall element is widely used not only as a proximity sensor, a linear position sensor, a rotation angle sensor, or the like, each of which is a sensor for detecting positional information of a magnet, but also as a current sensor for measuring, in a non-contact manner, the amount of current flowing in a current conductor by detecting a magnetic field induced by the current flowing in the current conductor.

Particularly, it is required for the current sensor used to detect an inverter current of a motor, to highly precisely detect the inverter current that is switched at a high-speed frequency, for the purpose of improving the efficiency of motor control.

Since the hall element has a magnetoelectric conversion function to generate a hall electromotive force signal depending on an intensity of an input magnetic field, the hall element is widely used as a magnetic sensor. However an offset voltage (unbalanced voltage) exists in the hall element. The offset voltage is a non-zero finite voltage and is output even in a state where the magnetic field is zero, i.e., in a state of no magnetic field.

In view of this, in regard to the magnetic sensor using a hall element, in order to cancel an offset voltage of the hall element, there is a driving method for the hall element, which is generally known as spinning current method or connection commutation method. In this method, switching between a position of a terminal pair for flowing a driving current to the hall element and a position of a terminal pair for detecting a hall electromotive force signal is periodically performed synchronized with clock called chopper clock (see, for example, Non Patent Document 1).

The spinning current method for the purpose of cancelling the offset voltage is configurable by use of a switching circuit in a CMOS semiconductor circuit, and therefore, a hall electromotive force detecting circuit to realize a highly-accurate magnetic sensor generally includes a switching circuit in order to implement the spinning current method.

Further, since a hall electromotive force signal generated in the hall element is generally feeble, the hall electromotive force signal detection circuit includes an signal amplifier circuit so as to amplify the hall electromotive force signal. Here, in a case where there is a finite offset voltage in this signal amplifier circuit, it is also necessary to perform the offset cancellation of the offset voltage included in the signal amplifier circuit.

Under these circumstances, as for the hall electromotive force signal detection circuit for detecting and amplifying the hall electromotive force generated by the hall element, there has been a known circuit configuration of signal amplifier circuit using a current feedback amplifier circuit that is suitable for the combination with the spinning current method of the hall element. Among these current feedback amplifiers, the circuit configuration in which the offset voltage of the amplifier circuit is modulated by using a chopper clock to the chopper clock frequency is generally known as chopper amplifier.

It is known that, with the use of a hall electromotive force detecting circuit in which the circuit for implementing the spinning current method in the hall element is combined with the circuit configuration of the chopper amplifier in the signal amplifier circuit, it is possible to modulate both the offset voltage of the hall element and the offset voltage of the signal amplifier circuit at the frequency of the chopper clock (see, for example, Patent Document 1 and Non Patent Document 2).

The offset cancellation of the hall element by the spinning current method is described below.

FIGS. 1A and 1B illustrate the hall electromotive force detection at the time when the direction of the driving current biasing the hall element is switched between 0 degree and 90 degrees every time the phase of the chopper clock is switched between two values, i.e., $\phi 1$ and $\phi 2$. FIG. 1A illustrates a case where the phase of the chopper clock is $\phi 1$ and the driving direction of the hall element is 0 degree, and FIG. 1B illustrates a case where the phase of the chopper clock is $\phi 2$ and the driving direction of the hall element is 90 degrees. Note that the hall element is modeled as a four-terminal element including four resistors, and is driven by a constant current.

In FIGS. 1A and 1B, when the driving direction of the hall element is switched between 0 degree and 90 degrees, voltage signals Vhall ($\phi 1$) and Vhall ($\phi 2$) measured in the hall element are represented as the sum of the hall electromotive force signal Vsig(B) corresponding to the target magnetic field B to be detected by the magnetic sensor using the hall element and the offset voltage Vos(Hall) of the hall element, as represented by Expression 1.

By periodically switching the direction of a bias current of the hall element between 0 degree and 90 degrees synchronized with the chopper clock, it is possible to switch the polarity of the hall electromotive force signal Vsig (B) corresponding to the target magnetic field to be detected between inverted polarity and non-inverted polarity, thereby making it possible to perform frequency modulation of the hall electromotive force signal Vsig(B) corresponding to the target magnetic field to be detected, at the frequency f_chop of the chopper clock. On the other hand, as for the DC offset voltage Vos (Hall) of the hall element, even if the driving direction of the hall element is switched between 0 degree and 90 degrees, the DC offset Vos(Hall) retains its polarity. Therefore, Vos(Hall) is not frequency-modulated by the chopper clock.

[Math. 1]

Signals Generated in the Hall Element      Expression 1

$$\begin{cases} Vhall(\phi 1) = +Vsig(B) + Vos(\text{Hall}) \text{ (Chopper Clock} = \phi 1) \\ Vhall(\phi 2) = -Vsig(B) + Vos(\text{Hall}) \text{ (Chopper Clock} = \phi 2) \end{cases}$$

Based on the foregoing, in a case where the driving current of the hall element is switched between 0 degree and 90 degrees synchronized with the chopper clock, the signal Vhall generated in the hall element exhibits a waveform as illustrated in FIGS. 2A to 2D. Further, the spectrum of the signal generated in the hall element exhibits a spectrum as illustrated in FIG. 3. Accordingly, it is understood that the hall electromotive force signal Vsig(B) corresponding to the target magnetic field to be detected and the offset voltage Vos (Hall) of the hall element are separated in the frequency domain. This is the principle of the offset cancellation using the spinning current method.

It is noted that the above description deals with an example in which the driving direction of the hall element having four terminals is switched between two directions, i.e., 0 degree and 90 degrees. Similarly, when the driving direction of the hall element is switched among four directions, i.e., 0 degree, 90 degrees, 180 degrees, and 270 degrees, it is also possible to separate the hall electromotive force signal and the offset voltage in the frequency domain.

Furthermore, a technique described in Patent Document 2 relates to a hall electromotive force signal detecting apparatus which is able to effectively minimize a pattern noise generated in a $\Delta\Sigma$ modulator used to detect a hall electromotive force signal of a hall element. Furthermore, a technique described in Patent Document 3 relates to a hall electromotive force signal detecting apparatus which performs a signal processing by use of a $\Delta\Sigma$ modulator and which is able to effectively minimize settling errors.

Furthermore, a technique described in Patent Document 4 relates to a current sensor, and discloses a method for reducing ripple-shaped noise by use of a filter called a Notch filter or a COMB filter having a zero point at the frequency of a chopper clock, in association with a circuit technique called chopper amplifier.

Furthermore, a technique described in Patent Document 5 relates to a chopper stabilized amplifier, and discloses a circuit configuration that suppresses the occurrence of ripple-shaped noise in an output of a signal amplifier circuit by feedback means.

Furthermore, a technique described in Patent Document 6 relates to an amplifier circuit that compensates an offset, in which a feedback circuit is prepared for the purpose of offset cancellation, and the feedback circuit herein is coupled to a signal node before the signal node in which the hall electromotive force signal modulated by the chopper clock is demodulated by a demodulator.

Further, a technique described in Patent Document 7 relates to, for example, a magnetic field sensor, which is provided with a sensor element for outputting a sensor signal including an interfering signal, an evaluation apparatus coupled to this sensor element, and a subtractor for subtracting the interfering signal from the sensor signal. The technique also relates to an interfering signal compensation method of the sensor and discloses an example in which a $\Delta\Sigma$ AD converter is used for signal processing of a hall element.

Further, a technique described in Patent Document 8 relates to a current measuring device for measuring a current flowing in the target object by means of measuring the magnetic field induced by the current flowing in the target object, and discloses an example in which double integral AD conversion is used for signal processing of a hall element.

PRIOR ART DOCUMENT

Patent Documents

Patent Document 1: JP 2008-309626 A
Patent Document 2: JP 2011-163928 A
Patent Document 3: JP 2011-169811 A
Patent Document 4: JP 2010-507095 T
Patent Document 5: U.S. Pat. No. 7,764,118 B2
Patent Document 6: U.S. Pat. No. 6,674,322 B2
Patent Document 7: JP 2007-525680 T
Patent Document 8: JP 2004-069466 A Non Patent Documents Non Patent Document 1: Written by R S Popovic, Hall Effect Devices (ISBN-10:0750300965) Inst of Physics Pub Inc (1991/05)
Non Patent Document 2: IEEE Journal of Solid-State Circuits, Vol. 32, No. 6, 1997, Pages 829 to 836, Written by Bilotti et al., "Monolithic Magnetic Hall Sensor Using Dynamic Quadrature Offset Cancellation"
Non Patent Document 3: IEEE Journal of Solid-State Circuits, Vol. 41, No. 12, 2006, Pages 2729 to 2736, Written by Burt and Zhang, "A Micropower Chopper-Stabilized Operational Amplifier Using a SC Notch Filter With Synchronous Integration Inside the Continuous-Time Signal Path"
Non Patent Document 4: IEEE Journal of Solid-State Circuits, Vol. 44, No. 12, 2009, Pages 3232 to 3243, Written by Wu et al., "A Chopper Current-Feedback Instrumentation Amplifier With a 1 mHz 1/f Noise Corner and an AC-Coupled Ripple Reduction Loop"
Non Patent Document 5: IEEE Journal of Solid-State Circuits, Vol. 40, No. 7, 2005, Pages 1533 to 1540, Written by Motz et al., "A Chopped Hall Sensor With Small Jitter and Programmable "True Power-On" Function"

SUMMARY OF THE INVENTION

Problem to be Solved

However, the techniques described in Patent Documents 1 to 3 do not disclose anything about a difference calculation circuit for detecting, in the output voltage signals, a component synchronized with the chopper clock by performing sampling at a timing obtained from the chopper clock, as disclosed in the present invention.

Further, in the technique described in Patent Document 4, ripple-shaped noise of an offset voltage modulated by a chopper clock is reduced by a filter in a subsequent stage, but in this case, various problems can occur as described below.

One use of the magnetic sensor using a hall element is a current sensor. In the current sensor using a hall element, an intensity of a magnetic field induced by a target current to be measured is measured in order to measure an amount of current flowing in a current conductor, which makes it possible to measure even a large current in a non-contact manner. Accordingly, the current sensor using a hall element is a sensor very suitable for measurement of an inverter current of a motor, and the like.

This current sensor is used to detect an inverter current which is switched at a high frequency, and is generally required to have a fast response of 10μ-seconds or less in terms of a signal processing delay time, as well as a wide-band property of approximately 100 kHz.

In a case where the hall element is used for the current sensor, it is difficult to achieve high accuracy in regard to detection accuracy of the current detection unless measures to cancel the offset voltages (the offset voltage of the hall element and the offset voltage of the signal amplifier circuit) are taken. In view of this, in a case where the hall element is used as the current sensor, the above-mentioned offset cancellation method using a chopper clock is used.

In a case where the above-mentioned offset cancellation method is used in the current sensor, if a narrow-band lowpass filter is used to reduce ripple-shaped noise occurring in the output signal of the signal amplifier circuit, it becomes difficult to satisfy the above-mentioned requirements such as the wide-band property and fast response. This is because the narrow-band lowpass filter has a long delay time (group delay time) of the filter. In addition, a problem with an increase in noise may be also caused.

On the other hand, a circuit configuration is also known in which a feedback is prepared from the output of the signal amplifier circuit to the signal amplifier circuit so that ripples do not occur, instead of reducing ripple-shaped noise occurring in the output signal of the signal amplifier circuit by a filter in the subsequent stages. That is, the circuit configuration detects a DC offset that causes the ripple-shaped noise from the ripple-shaped noise occurring in the output signal of the signal amplifier circuit, and the detected DC offset is subtracted in the signal amplifier circuit, so as to prevent the occurrence of the ripple-shaped noise. An example of this circuit configuration is exemplified in Non Patent Document 4.

In the circuit configuration disclosed in Non Patent Document 4, capacitive coupling by use of capacitors is used so as to detect a DC offset voltage component in the ripple-shaped noise occurring in the output signal of the signal amplifier circuit. However, the configuration using such capacitors cannot be used when a target frequency bandwidth to be detected is wide as in the case of the current sensor.

In order to explain the reason thereof, the following describes a clear distinction between the hall electromotive force signal detection circuit for a current sensor, used for current detection of an inverter, and the signal amplifier circuit used for an instrumentation (e.g., see Non Patent Document 4).

In the case of the above-mentioned Non Patent Document 4 belonging to a technical field of the signal amplifier circuit for instrumentation, the signal amplifier circuit is designed for the purpose of detecting a low-frequency signal of a few Hz, and there is a sufficient difference of approximately 10000 times between the frequency (40 kHz) of the chopper clock described in Non Patent Document 4 and a frequency bandwidth (a few Hz) of a target signal to be detected. In view of this, even if the DC offset voltage is detected in the ripple-shaped noise by means of capacitive coupling using capacitors, the detected DC offset voltage is not mixed with the target signal to be detected.

On the other hand, in the current sensor used for current detection of an inverter, since a bandwidth of a target current signal to be detected is wide (approximately 100 kHz), a frequency of the chopper clock should be correspondingly increased to a higher-frequency side. However, due to limitations in circuit design, such as settling of the output signal of the signal amplifier circuit, the frequency of the chopper clock in the current sensor is around 500 kHz at most. As understood from this, in the current sensor, the ratio between the frequency bandwidth of the target signal to be detected and the frequency of the chopper clock is only around five times at most. Accordingly, when the DC offset voltage is detected in the ripple-shaped noise, the possibility of mixing the detected DC offset voltage with the target signal to be detected will increase. In view of this, in the current sensor used for current detection of an inverter, in order to detect the DC offset voltage from ripple-shaped noise, it is necessary to design a more accurate method, rather than a simple method such as capacitive coupling by use of capacitors as disclosed in Non Patent Document 4.

Further, the technique described in Patent Document 5 is disclosed as a continuous-time analog switch which performs switching control of the polarity of a differential signal between inversion and non-inversion, by use of a "third chopping circuit" which modifies the signal coupling of the differential signal. In contrast, the difference calculation circuit of the present invention performs discrete time sampling of the input signal to the difference calculation circuit, so as to calculate the time variation of the input signal in a given period of time.

Further, in the technique described in Patent Document 6, "DEM1" indicates a chopper demodulator, however, this technique is different from the configuration of the present invention in that feedback is performed before "DEM1" as the chopper demodulator.

Differences between the present invention and Non Patent Document 5 and Patent Document 6 described above are investigated below. In Non Patent Document 5 and Patent Document 6, a feedback circuit is prepared for the purpose of offset cancellation. However, the feedback in Non Patent Document 5 and Patent Document 6 is essentially different from that of the present invention in that the feedback is performed from a signal node before the hall electromotive force signal modulated by a chopper clock is demodulated by a demodulator. Further, Patent Documents 7 and 8 do not disclose anything about the characteristic configuration of the present invention at all.

Further, when the hall electromotive force signal detection circuit is used in an environment with high-frequency noise, such as for an inverter, the main signal path of the hall electromotive force signal detection circuit is preferably a circuit that is able to perform continuous-time signal processing, rather than discrete-time signal processing, in order to prevent fold over noise by discretization in time (sampling).

The present invention is accomplished in view of such circumstances, and an object of the present invention is to provide a hall electromotive force signal detection circuit and a current sensor thereof each of which has excellent accuracy, wide band characteristics, and fast response and further has a main signal path of the circuit configurable by use of a continuous-time signal processing circuit.

Solution to the Problem

The present invention is accomplished in order to achieve the above object. According to an aspect of the present invention, there is provided a hall electromotive force signal detection circuit configured to suppress an offset signal component in a signal composed of a hall electromotive force signal generated in a Hall element and the offset signal component, and amplify the hall electromotive force signal to generate an output signal, the hall electromotive force signal detection circuit including: a signal amplifier circuit configured to amplify an output of the hall element and output a signal having the offset signal component modulated at a frequency of a chopper clock; a difference calculation circuit configured to sample a component synchronous with the chopper clock out of an output signal of the signal amplifier circuit at a timing synchronous with the chopper clock, and output a difference between sampling results which are sampled at different time; an integrating circuit configured to integrate the output of the difference calculation circuit in the time domain; and a feedback circuit configured to feedback an output signal of the integrating circuit to the signal amplifier circuit.

Further, the hall electromotive force signal detection circuit includes a first switching circuit configured to perform switching operations on terminal pairs of the Hall element in which a terminal pair for driving a driving current to the hall element and a terminal pair for detecting the hall electromotive force signal are interchanged, and to modulate the hall electromotive force signal generated in the hall element at the frequency of the chopper clock. The signal amplifier circuit amplifies the output signal from the first switching circuit and the output signal of the signal amplifier is modulated at the frequency of the chopper clock, so that the hall electromotive force signal is demodulated to a low-frequency component including a direct current component, and outputs a signal having the offset signal component modulated at the frequency of the chopper clock.

Further, the signal amplifier circuit includes: a first transconductance element configured to convert an output voltage signal of the first switching circuit into a current so as to generate a first current; resistors configured to perform voltage-division on a component included in the output voltage signal of the first switching circuit at a predetermined ratio; a second switching circuit configured to invert the polarity of a voltage generated by the voltage-division according to the chopper clock; and a second transconductance element configured to convert an output voltage from the second switching circuit into a current so as to generate a second current. The feedback circuit includes a third transconductance element configured to convert an output voltage from the integrating circuit into a current so as to generate a third current, and with regard to a current sum of the first current I1, the second current I2, and the third current I3, the feedback circuit performs feedback operation in which a DC component included in the sum of the first current and the second current in the signal amplifier circuit is added with the third current such that the current sum becomes zero (I1+I2+I3=0).

Further, a third switching circuit configured to modulate an input signal at the frequency of the chopper clock, and an output stage coupled to the third switching circuit are provided in a subsequent stage of the first transconductance element.

Further, a fourth transconductance element is provided between a subsequent stage of the third switching circuit and the difference calculation circuit.

Further, the difference calculation circuit and the integrating circuit are switched capacitor circuits.

Further, the difference calculation circuit is composed of AD converters, and the integrating circuit is constituted of digital circuits.

Further, the AD converter is a ΔΣ-modulation AD converter.

Further, the AD converter is a double-integral AD converter.

Further, according to another aspect of the present invention, there is provided a current sensor using the above-mentioned hall electromotive force signal detection circuit.

Advantageous Effects of the Invention

According to the present invention, it is possible to provide a hall electromotive force signal detection circuit and a current sensor thereof each of which has excellent accuracy, wide band characteristics, and fast response and further has a main signal path of the circuit is configurable by a continuous-time signal processing circuit.

BRIEF DESCRIPTION OF THE DRAWINGS

FIGS. 2A to 2D illustrate signal waveforms occurring in the hall element.

FIG. 15 is a circuit configuration diagram illustrating an example of a feedback circuit that is different from the feedback circuit of the hall electromotive force signal detecting apparatus according to the present embodiment as illustrated in FIG. 7.

DESCRIPTION OF EMBODIMENTS

With reference to drawings, the following describes embodiments of the present invention.

The above-mentioned description deals with offset cancellation technique by use of the driving method (the spinning current method) of a hall element using a chopper clock. As to the hall element that performs the spinning current method, the following describes a configuration of a hall electromotive force signal detection circuit, which will be a premise of the present embodiment, with reference to FIG. 4.

Figure 1A:
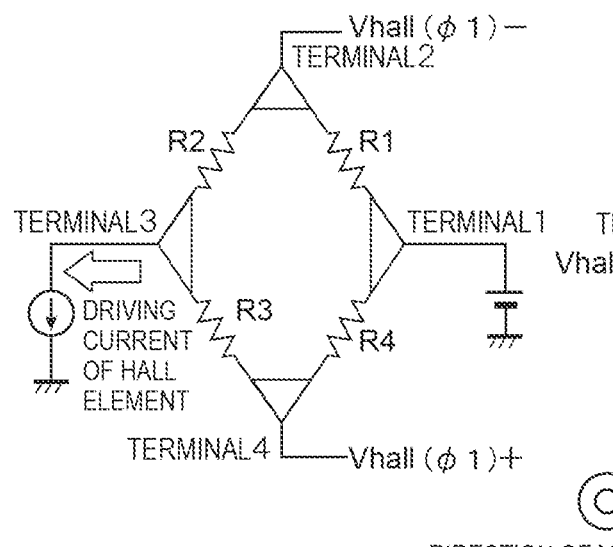
FIGS. 1A and 1B illustrate hall electromotive force detection at the time when the direction of a driving current that biases a hall element is switched between 0 degree and 90 degrees every time the phase of the chopper clock is changed between two values, i.e., φ1 and φ2.
Figure 1B:
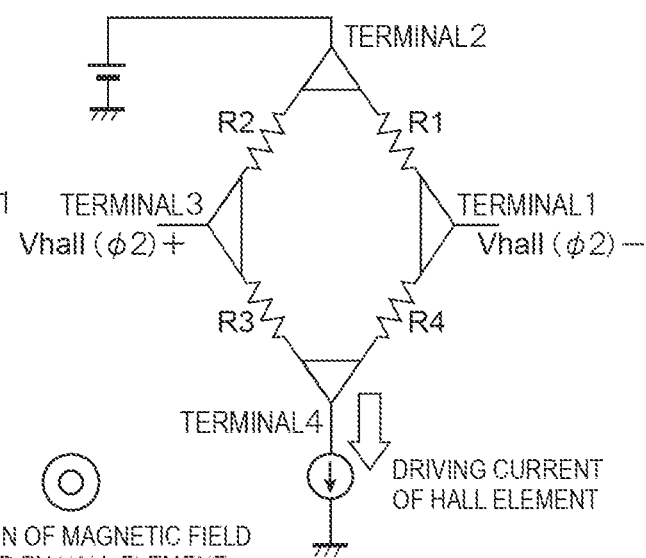
Figure 3:
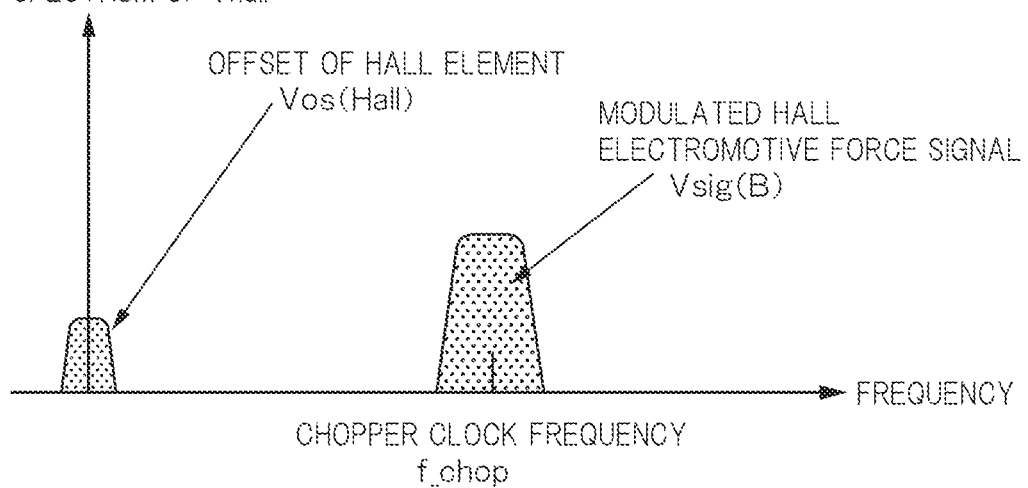
FIG. 3 illustrates a signal spectrum of a signal Vhall occurring in the hall element.
Figure 4:
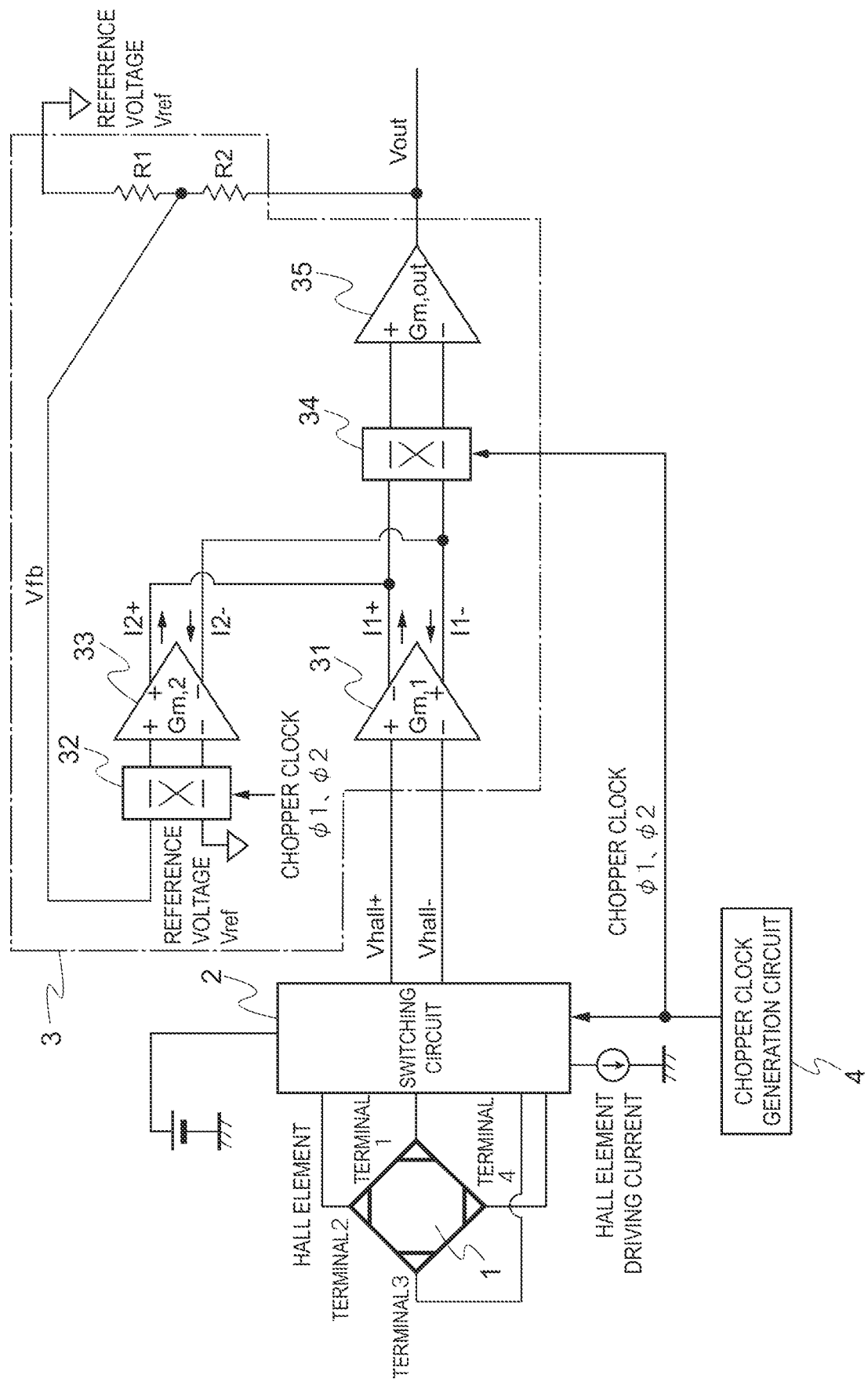
FIG. 4 is a circuit configuration diagram to describe a hall electromotive force signal detection circuit as a premise of the present embodiment.
Figure 5:
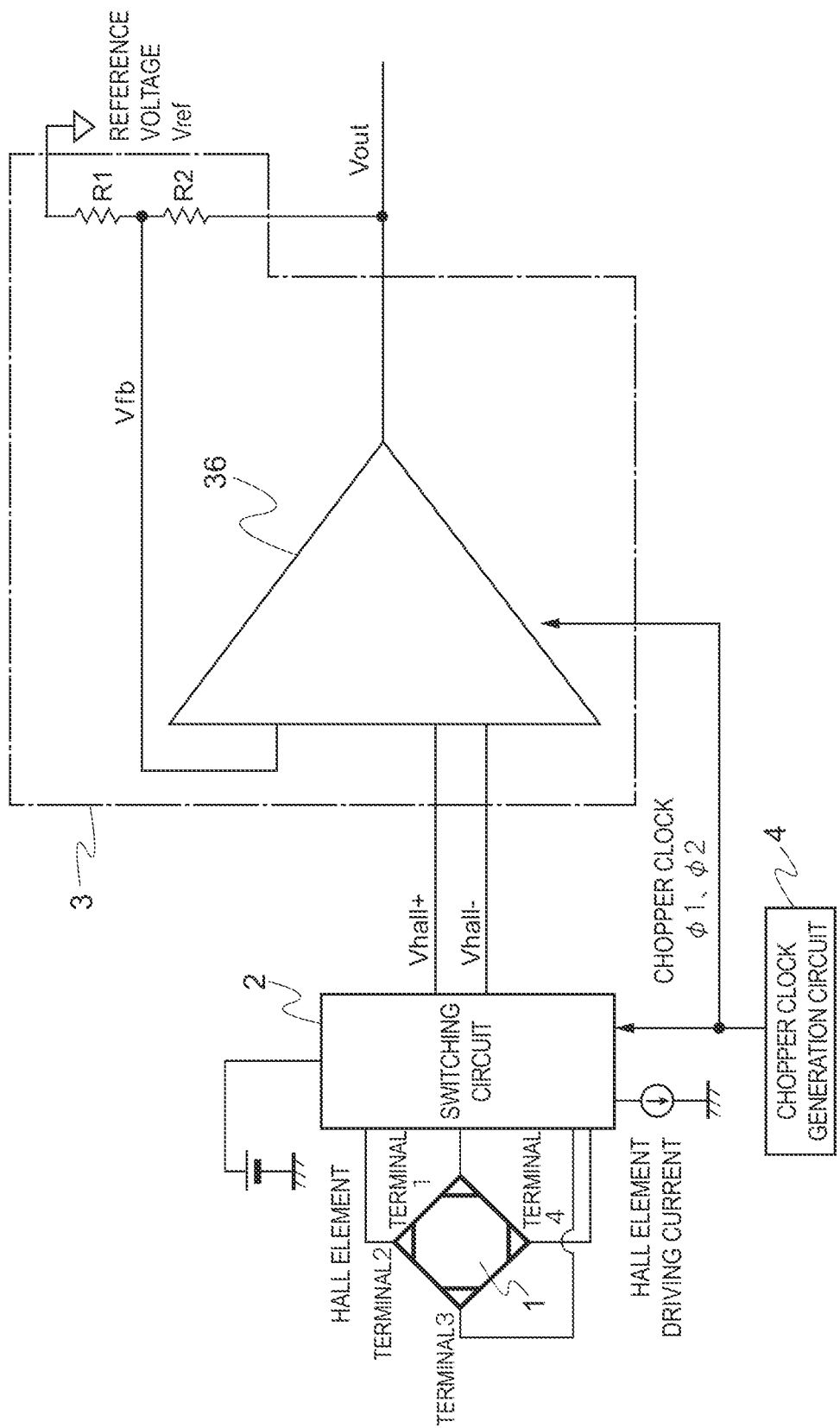
FIG. 5 is a circuit configuration diagram to understand FIG. 4.

FIG. 4 is a circuit configuration diagram to describe a hall electromotive force signal detection circuit, as a premise of the present embodiment, and FIG. 5 is a circuit configuration diagram to understand FIG. 4. In these figures, a reference sign 1 indicates a hall element, a reference sign 2 indicates a first switching circuit, a reference sign 3 indicates a signal amplifier circuit, a reference sign 4 indicates a chopper clock generation circuit, a reference sign 31 indicates a first transconductance element (a transistor differential pair; Gm, 1), a reference sign 32 indicates a second switching circuit, a reference sign 33 indicates a second transconductance element (a transistor differential pair; Gm, 2), a reference sign 34 indicates a third switching circuit, a reference sign 35 indicates a output stage of the signal amplifier circuit 3 (a transistor differential pair; Gm, out), and a reference sign 36 indicates an operational amplifier.

In the hall electromotive force signal detection circuit illustrated in FIG. 4, a signal Vhall input into the signal amplifier circuit 2 from the hall element 1 is input to the transistor differential pair Gm, 1, and a current I1 is generated according to Expression 2. Here, there also exist an offset Vos(Gm, 1) in the transistor differential pair Gm, 1 of the signal amplifier circuit, and therefore, the current I1 is affected by this offset voltage Vos(Gm, 1).

Note that, in FIG. 4, the current I1 is a differential signal. In view of this, in regard to reference signs I1+ and I1− in FIG. 4, the following relationship is assumed: I1=(I1+)−(I1−).

Expression 2: Output Current I1 from Transistor Differential Pair Gm, 1

[Math. 2]
$$\begin{cases} I1(\phi1) = Gm, 1 \cdot (Vhall(\phi1) + Vos(Gm, 1)) = \text{(Chopper} \\ Gm, 1 \cdot (+Vsig(B) + Vos(Hall) + Vos(Gm, 1)) \quad \text{Clock} = \phi1) \\ I1(\phi2) = Gm, 1 \cdot (Vhall(\phi2) + Vos(Gm, 1)) = \text{(Chopper} \\ Gm, 1 \cdot (-Vsig(B) + Vos(Hall) + Vos(Gm, 1)) \quad \text{Clock} = \phi2) \end{cases}$$

Note that in the hall electromotive force signal detection circuit illustrated in FIG. 4, the number of hall elements 1 is one. However, since a hall electromotive force signal generated in the hall element 1 is converted into a current according to Expression 2, even in the case where a plurality of hall elements is used, it is possible to detect the sum of the hall electromotive force signals generated in the plurality of hall elements by converting hall electromotive force signals corresponding to respective hall elements into currents and adding those currents together.

In the hall electromotive force signal detection circuit illustrated in FIG. 4, a feedback from the output voltage Vout by use of resistors R1 and R2 is prepared, and a feedback voltage Vfb from the output voltage Vout is generated according to Expression 3.

[Math. 3]

Feedback from Output Voltage $\qquad$ Expression 3

Vout of Signal Amplifier Circuit $$Vfb = \frac{R1}{R1 + R2} Vout$$

The transistor differential pair Gm, 2 in the signal amplifier circuit 3 is driven by the feedback voltage Vfb represented by Expression 3 from the output voltage Vout. However, since there exists an offset Vos(Gm, 2) in the transistor differential pair Gm, 2, a current I2 output from Gm, 2 is represented by Expression 4.

Note that, in FIG. 4, the current I2 is a differential signal. In view of this, in regard to reference signs I2+ and I2− in FIG. 4, the following relationship is assumed: I2=(I2+)−(I2−).

[Math. 4]

Output Current I2 from $\qquad$ Expression: 4

Transistor Differential Pair Gm, 2

$$\begin{cases} I2(\phi1) = +Gm, 2 \cdot Vfb + Gm, 2 \cdot Vos(Gm, 2) \text{ (Chopper Clock} = \phi1) \\ I2(\phi2) = -Gm, 2 \cdot Vfb + Gm, 2 \cdot Vos(Gm, 2) \text{ (Chopper Clock} = \phi2) \end{cases}$$

In the hall electromotive force signal detection circuit illustrated in FIG. 4, the feedback works so that the sum of the output current I1 from the transistor differential pair Gm, 1 and the output current I2 from the transistor differential pair Gm, 2 becomes zero. Accordingly, when the output voltage Vout of the hall electromotive force signal detection circuit of FIG. 4 is calculated on the basis of I1+I2=0, Expression 5 is obtained.

Here, as represented by Expression 5, it should be noted that the signal Vsig (B) which is modulated by the chopper clock of the chopper clock generation circuit 4 is demodulated by the third switching circuit 34 in FIG. 4. As such, the signal Vsig (B) to be detected is modulated by the chopper clock in the previous stage, and then demodulated by the chopper clock in the subsequent stage. In view of this, the category of the circuit which includes the signal amplifier circuit 3 of FIG. 4 is called chopper amplifier.

[Math. 5]

$\qquad$ Expression 5

Output Voltage Vout of Hall Electromotive Force Detection Circuit $$\begin{cases} V_{out(\phi1)} = \left(1 + \frac{R2}{R1}\right)\left(\frac{Gm, 1}{Gm, 2}\right) V_{sig(\beta)} - \\ \left\{\frac{Gm, 1 \cdot Vos(\text{Hall}) + Gm, 1 \cdot}{Vos(Gm, 1) + Gm, 2 \cdot Vos(Gm, 2)}\right\} \text{(Chopper Clock} = \phi1) \\ V_{out(\phi2)} = \left(1 + \frac{R2}{R1}\right)\left(\frac{Gm, 1}{Gm, 2}\right) V_{sig(\beta)} + \\ \left\{\frac{Gm, 1 + Vos(\text{Hall}) + Gm, 1 \cdot}{Vos(Gm, 1) + Gm, 2 \cdot Vos(Gm, 2)}\right\} \text{(Chopper Clock} = \phi2) \end{cases}$$

Figure 6:
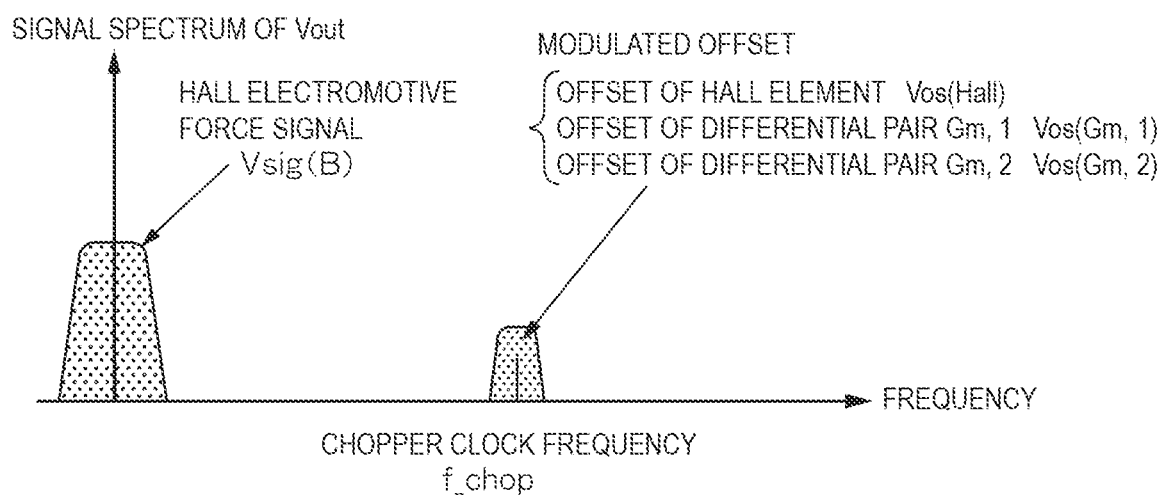
FIG. 6 illustrates a signal spectrum in an output voltage Vout of a signal amplifier circuit.

The polarity of the part which is placed between parentheses "{"and"}" in Expression 5 is inverted every time the phase of the chopper clock is switched between φ1 and φ2. As can be seen from this, in the hall electromotive force signal detection circuit illustrated in FIG. 4, every time the phase of the chopper clock is switched between φ1 and φ2, the sum of the offset voltage of the hall element, the offset voltage of Gm, 1 and the offset voltage of Gm, 2 is modulated by the chopper clock, and ripple-shaped noise in the output Vout of the signal amplifier circuit is generated. From Expression 5, it can be understood that the signal spectrum of the output Vout of the signal amplifier circuit exhibits a spectrum as illustrated in FIG. 6. In FIG. 6, the component located in the chopper clock frequency f_chop is ripple-shaped noise superposed on the output signal Vout of the signal amplifier circuit.

Further, in a case where presence of the above-mentioned ripple-shaped noise is removed from Expression 5, Expression 6 is obtained. It is shown that, in the hall electromotive force signal detection circuit illustrated in FIG. 4, the hall electromotive force signal Vsig(B) corresponding to a target magnetic field B to be detected by the magnetic sensor is amplified by the predetermined signal amplification gain (1+R2/R1) (Gm, 1/Gm, 2).

[Math. 6]

Expression of Signal Amplification of Hall Electromotive Force Signal   Expression 6

$$Vout = \left(1 + \frac{R2}{R1}\right)\left(\frac{Gm, 1}{Gm, 2}\right) Vsig(B)$$

With reference to drawings, the following describes embodiments of the present invention.

Figure 7:
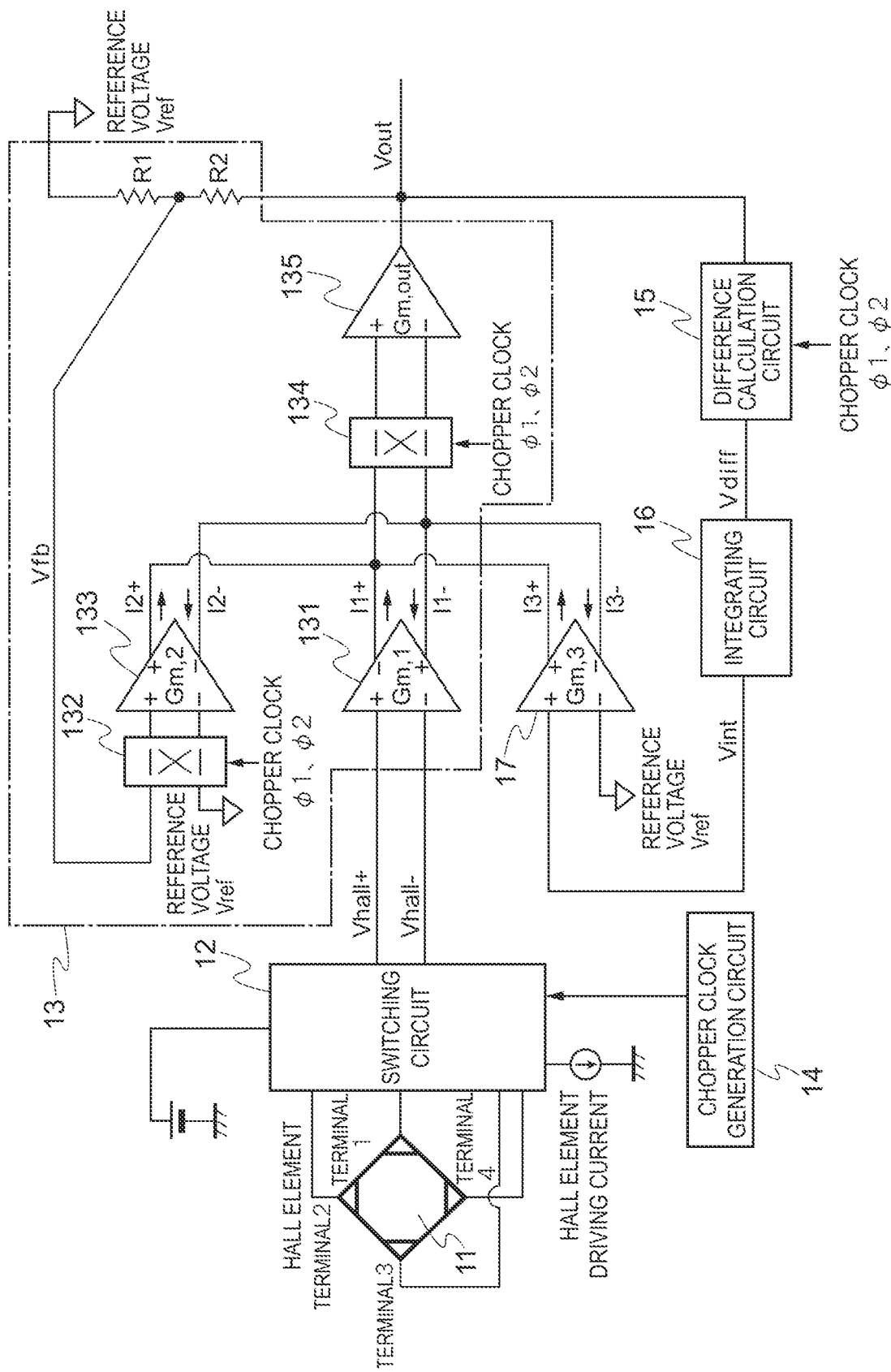
FIG. 7 is a circuit configuration diagram to describe one example of the hall electromotive force signal detection apparatus according to the present embodiment.

FIG. 7 is a circuit configuration diagram to describe one example of the hall electromotive force signal detection circuit according to the present embodiment. In the figure, a reference sign 11 indicates a hall element, a reference sign 12 indicates a first switching circuit, a reference sign 13 indicates a signal amplifier circuit, a reference sign 14 indicates a chopper clock generation circuit, a reference sign 15 indicates a difference calculation circuit, a reference sign 16 indicates an integrating circuit, a reference sign 17 indicates a third transconductance element (a transistor differential pair; Gm, 3), a reference sign 131 indicates a first transconductance element (a transistor differential pair; Gm, 1), a reference sign 132 indicates a second switching circuit, a reference sign 133 indicates a second transconductance element (a transistor differential pair; Gm, 2), a reference sign 134 indicates a third switching circuit, and a reference sign 135 indicates an output stage of the signal amplifier circuit 13 (a transistor differential pair; Gm, out). Note that the first switching circuit 12 is a switching circuit which is prepared to implement the spinning current method. Further, the portion (a circuit including "a third transconductance element 17") which receives an output of the integrating circuit 16 and returns it to the signal amplifier circuit 13 is called feedback circuit.

The present embodiment is a hall electromotive force signal detection circuit for generating an output voltage signal obtained by amplifying a hall electromotive force signal generated in a hall element, with a predetermined signal amplification gain. The first switching circuit 12 is configured to perform switching operations on the terminal pairs of the hall element 11 in which a terminal pair for driving a driving current to the hall element 11 and a terminal pair for detecting a hall electromotive force signal are interchanged, and to modulate a hall electromotive force signal generated in the hall element 11 at the frequency of the chopper clock.

Further, the chopper clock generation circuit 14 generates a chopper clock for periodically driving the first switching circuit 12. Further, the signal amplifier circuit 13 amplifies an output voltage signal from the first switching circuit 12.

Further, the difference calculation circuit 15 samples a signal component synchronized with the chopper clock generated by the chopper clock generation circuit 14, out of the output voltage signal of the signal amplifier circuit 13, at a timing obtained from the chopper clock, so as to detect the signal component. Further, the integrating circuit 16 integrates an output of the difference calculation circuit 15 in the time domain. Further, the third transconductance element 17 converts an output voltage of the integrating circuit 16 into a current to generate a third current.

Further, the signal amplifier circuit 13 includes: the first transconductance element 131 for converting a hall electromotive force signal into a current so as to generate a first current; resistors R1 and R2 for performing voltage-division on the output voltage signal at a given ratio; the second switching circuit 132 for reversing a polarity of a voltage generated by the voltage-division, according to the chopper clock; the second transconductance element 133 for converting an output voltage of the second switching circuit 132 into a current so as to generate a second current; the third switching circuit 134 provided in the subsequent stage of the first transconductance element 131 and performing a demodulation operation at a chopper clock frequency; and the output stage 135 coupled to this third switching circuit 134.

With such a configuration, an output voltage signal from the integrating circuit 16 is fed back to the signal amplifier circuit 13 via the third transconductance element 17. That is, with regard to a current sum of the first current I1, the second current I2, and the third current I3, feedback is performed on a DC component included in a sum of the first current and the second current via the third transconductance element 17 which converts an output voltage from the integrating circuit 16 into a current to generate the third current, so that the sum including the third current becomes zero (I1+I2+I3=0).

Further, in the present embodiment, a current sensor may be constituted of the above-mentioned hall electromotive force signal detection circuit.

(Feedback Circuit for Suppressing Occurrence of Ripple)

The following describes the hall electromotive force signal detection circuit according to the present embodiment with reference to FIG. 7. In FIG. 7, between the output signal Vout of the signal amplifier circuit 13 which amplifies a hall electromotive force signal and the circuit node in which the current I1 and the current I2 are added in the signal amplifier circuit 13, a feedback circuit is prepared.

This feedback circuit is constituted of the difference calculation circuit 15, the integrating circuit 16, and the third transconductance element 17. The current I3 output from this third transconductance element 17 acts to cancel a component Ios of a DC offset current included in a current I1+I2=Gm, 1·Vhall+Gm, 2·Vfb, represented by Expression 7.

Note that, in FIG. 7, the current I3 is a differential signal. In view of this, in regard to reference signs I3+ and I3− in FIG. 7, the following relationship is assumed: I3=(I3+)−(I3−).

[Math. 7]

Figure 9:
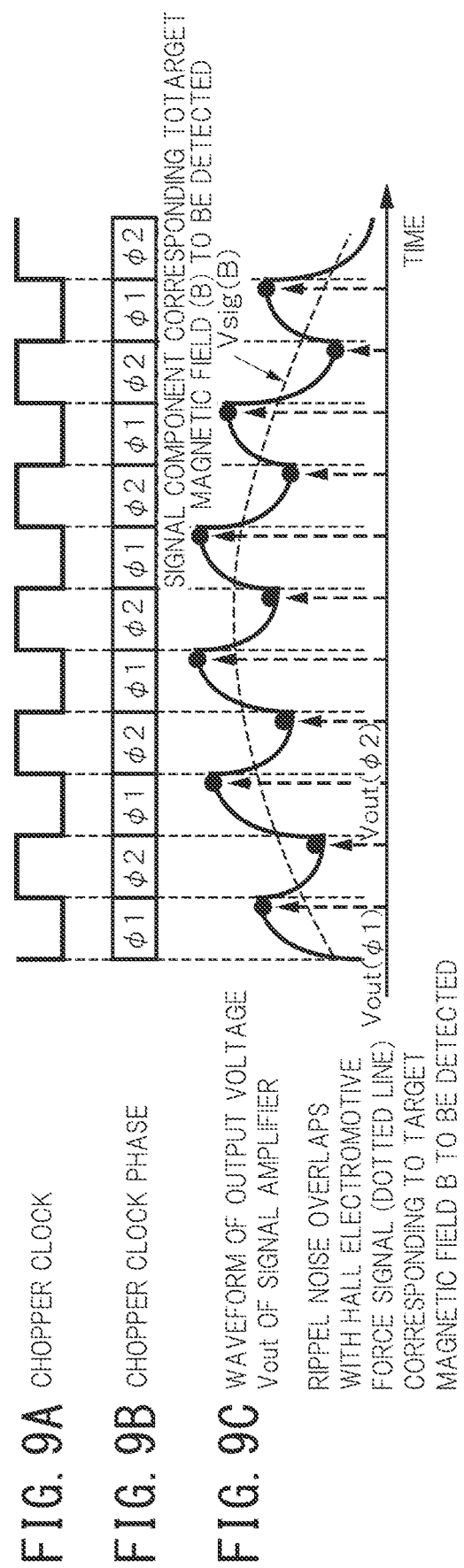
FIGS. 9A to 9C illustrate waveforms of a signal amplifier circuit Vout in a case where the time variation is fast in a target magnetic field B to be detected by the magnetic sensor using a hall element.

DC Offset Current Ios Causing Ripple-Shaped Noise
Ios=Gm, 1·Vos(Hall)+Gm, 1·Vos(Gm, 1)+Gm, 2·Vos(Gm, 2)   Expression 7:

The DC offset current Ios, represented by Expression 7, is a DC offset current resulted from the voltage to current conversion in which an offset voltage of the hall element, offset voltages in the transistor differential pair (Gm, 1) 131, and the transistor differential pair (Gm, 2) 133 are converted to an current signal by use of the transistor differential pair. When this DC offset current Ios is modulated at a frequency of a chopper clock in the third switching circuit 134, ripple-shaped noise (FIG. 9) occurs in the output voltage signal Vout of the signal amplifier circuit 13. In view of this, when feedback is performed by the feedback current I3 so that the DC component Ios contained in (I1+I2) is added with I3 and the resulting sum becomes zero, it is possible to eliminate the occurrence of the ripple-shaped noise.

(Difference Calculation Circuit)

For the purpose of detecting a component of a chopper clock frequency from the ripple-shaped noise in the signal amplifier output signal Vout with high accuracy, the above-mentioned feedback performs time discretization (sampling) on the signal amplifier output signal Vout at a timing just before the chopper clock changes.

That is, Vout($\phi$1) is detected by sampling at a timing just before a chopper clock phase changes from $\phi$1 to $\phi$2, Vout($\phi$2) is detected by sampling at a timing just before the chopper clock phase changes from $\phi$2 to $\phi$1, and a difference signal Vout($\phi$1)–Vout($\phi$2) between Vout($\phi$1) and Vout($\phi$2) is calculated as a discrete-time signal. Thus, it is the function of the difference calculation circuit 15 in the present embodiment to perform a calculation of the time variation of Vout between two timing separated at a certain time period (calculation corresponding to time derivatives).

(Integrating Circuit in Subsequent Stage of Difference Calculation Circuit)

In the example in FIG. 7 of the hall electromotive force signal detecting apparatus of the present embodiment, the integrating circuit 16 is placed in a subsequent stage of the difference calculation circuit 15. This integrating circuit 16 performs time integration (lowpass filter) on an amplitude component of the ripple-shaped noise detected by the difference calculation circuit 15, i.e., a DC component which is the source of the ripple-shaped noise, to remove various noise components from an output signal from the difference calculation circuit 15.

As described later, in the hall electromotive force signal detecting apparatus of the present embodiment, since the difference calculation circuit 15 is a circuit for performing time discretization (sampling), a switched capacitor circuit and a digital circuit can be used for the integrating circuit 16, and, as a result, various desirable features can be realized.

(Hall Electromotive Force Signal Detection Circuit According to Present Embodiment)

As for the circuit configurations which suppress the occurrence of ripple-shaped noise in the output of the signal amplifier circuit 13 by feedback means, these circuit configurations are described in Non Patent Document 4 and Patent Document 5 which are mentioned before. Although, each of these documents deals with a circuit of capacitive coupling using capacitors and a circuit to invert its signal polarity with switch circuit as a circuit measure for detecting a DC component in the ripple-shaped noise, there is no description in these documents about the concept of a difference calculation circuit which is a characteristic configuration of the present embodiment.

It is explained in the following that the difference calculation circuit, which is the characteristic configuration of the present embodiment, makes it possible to achieve high accuracy of feedback that suppresses the occurrence of ripple-shaped noise in an output of a signal amplifier circuit. Particularly, the difference calculation circuit 15, which is the characteristic configuration of the present embodiment, can be a suitable circuit configuration in the applications such as current sensor designed to detect a switching current of an inverter, where a frequency bandwidth of a target magnetic field signal to be detected is relatively wider than the chopper clock frequency.

Figure 8:
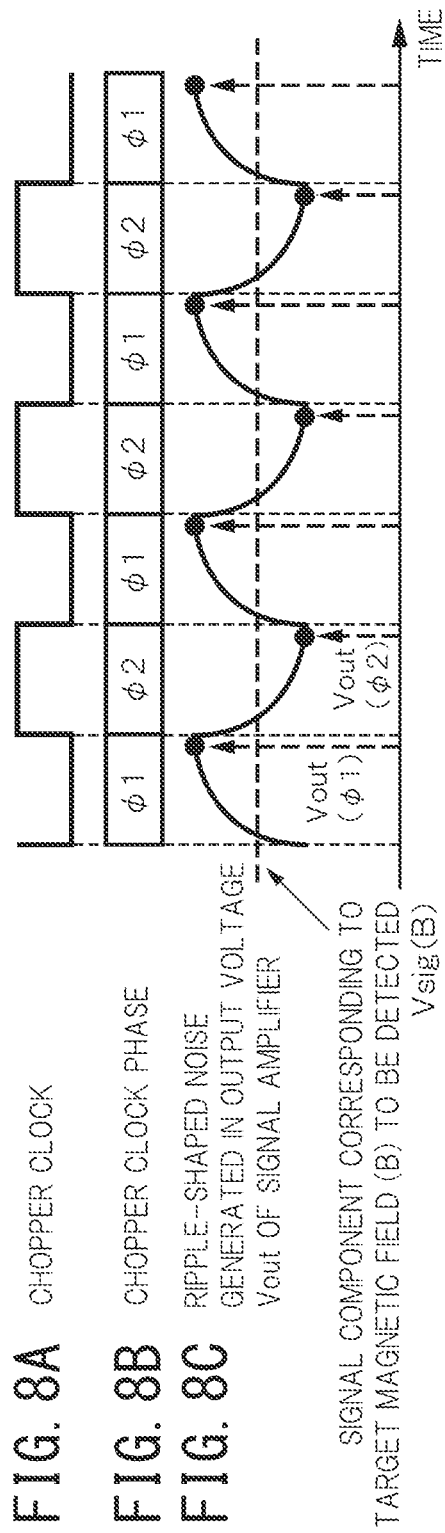
FIGS. 8A to 8C illustrate a state where Vout(φ1) and Vout(φ2) are detected by sampling in a case where there is no time variation in a target magnetic field to be detected by a magnetic sensor using a hall element or the time variation is moderately slow.

FIGS. 8A to 8C illustrate a state where Vout($\phi$1) and Vout($\phi$2) are detected by sampling in a case where there is no time variation in the target magnetic field to be detected by a magnetic sensor using a hall element or the time variation is slow enough. Even in this case, if a slew rate of an output stage (Gm, out) 135 of the signal amplifier for the rising voltage is unbalanced with a slew rate thereof for the falling voltage, an unbalance arises in the waveform of the ripple-shaped noise between the rising period and the falling period.

Under these circumstances, in the case of Non Patent Document 4 and Patent Document 5, the unbalance between the period of rising voltage and the period of falling voltage in the ripple-shaped noise causes an error in feedback to suppress the occurrence of the ripple-shaped noise. As the chopper clock frequency is increased to a higher frequency, such unbalance becomes more significant.

In contrast to this, in the difference calculation circuit, which is the characteristic configuration of the present embodiment, sampling is performed at a timing just before the chopper clock changes. In view of this, as far as the ripple-shaped noise settles into a constant value within the half of the chopper clock period, the difference calculation circuit is not affected by such unbalance between the rising period and the falling period.

FIGS. 9A to 9C illustrate waveforms of the signal amplifier circuit Vout in a case where time variation is fast in the target magnetic field B to be detected by the magnetic sensor using a hall element. The situation illustrated in FIGS. 9A to 9C occurs when the band width of the signal frequency of the target magnetic field B to be detected is relatively wider than the chopper clock frequency, as in the case of a current sensor designed to detect a switching current of an inverter.

In such a case, a signal Vsig (B) corresponding to the time variation of the target magnetic field B to be detected is mixed into sampled Vout($\phi$1) and Vout($\phi$2) (Expression 8). Notwithstanding, the circuit configuration of the hall electromotive force signal detection circuit according to the present embodiment is a circuit configuration which can minimize the influence of Vsig (B).

In order to describe this feature of the present embodiment, the following deals with a case where a value of Vout($\phi$1) sampled in chopper clock phase $\phi$1 at a time n is represented to be Vout($\phi$1) (n), similarly, a value of Vout($\phi$2) sampled in chopper clock phase $\phi$2 at a time n is represented to be Vout($\phi$2) (n), and a difference signal Vout($\phi$1)(n)–Vout($\phi$2)(n) therebetween is integrated for N times with respect to the time n. Here, in a case where the target magnetic field B to be detected is a magnetic field induced by an inverter current that drives a motor, the signal Vsig(B) exhibits a sinusoidal wave form of which cycle is the same as the cycle of the inverter driving current of the motor. Accordingly, if an integration times N herein is set to be a sufficiently large number, it becomes possible to detect a ripple component (a DC offset component as a source of ripple) with high accuracy while eliminating the influence of Vsig (B), as understood from Expression 9.

Further, it is a well-known fact that switched capacitor circuits and digital circuits are suitable circuit configurations for the purpose of realizing integrating circuits and narrow-band filters.

[Math. 8]

Ripple Detection When Time Variation of Target Magnetic Signal $B$ to be Detected is Fast  (Expression 8)

$$Vout(\phi 1) - Vout(\phi 2) = \{\text{Ripple Component}\} + Vsig(B)$$

[Math. 9]

Elimination of Influence of $Vsig(B)$ on Ripple by Integration of $\{Vout(\phi 1) - Vout(\phi 2)\}$  (Expression 9)

$$\sum_{n=1}^{N}\{Vout(\phi 1)(n) - Vout(\phi 2)(n)\} = N \times \{\text{Ripple Component}\}$$

The difference calculation circuit, which is the characteristic configuration of the present embodiment, has the following two advantages because digital circuits can be utilized in the subsequent stages of the difference calculation circuit.

The first advantage when the digital circuit is used for the circuit placed in the subsequent stage of the difference calculation circuit 15 is the reduction of an initial pull-in time of the feedback loop that suppresses the occurrence of ripple-shaped noise in the output of the signal amplifier circuit 13. As described above, this feedback loop is a feedback loop with a very narrow bandwidth, and therefore, a long time is generally required for the initial pull-in time, where the initial pull-in time means the time which is required for the feedback loop to converge and settle the ripple-shaped noise converged to zero after the initial operation of the hall electromotive force signal detection circuit is started after power-on. Here, if a digital circuit is used for the circuit in the subsequent stage of the difference calculation circuit 15, it is easy to implement, in the digital circuit, an adaptive algorithm in which the time constant of the feedback loop may be switched between the initial period before the initial pull-in operation is completed and the steady operation period after the initial pull-in operation is completed, thereby making it possible to realize the reduction of the initial pull-in time.

The second advantage obtained when a digital circuit is used for the circuit placed in the subsequent stage of the difference calculation circuit 15 is the realization of robustness of the feedback loop. The current sensor used for detecting a switching current of an inverter is used under an environment with strong disturbance noise such as electromagnetic induction noise and electrostatic induction noise which are generated at the time of the switching of the inverter. Because of this, in the current sensor used for detecting a switching current of an inverter, the disturbance noise is input into the feedback loop that suppresses the occurrence of ripple-shaped noise in the output of the signal amplifier circuit 13. However, in a case where a digital circuit is used for the circuit in the subsequent stage of the difference calculation circuit, it is possible to implement algorithms that are insusceptible to such disturbance noise in the digital circuit, thereby making it possible to realize the robustness of the feedback loop.

(Example of Difference Calculation Circuit and Integrating Circuit Using Switched Capacitor Circuits)

Figure 10:
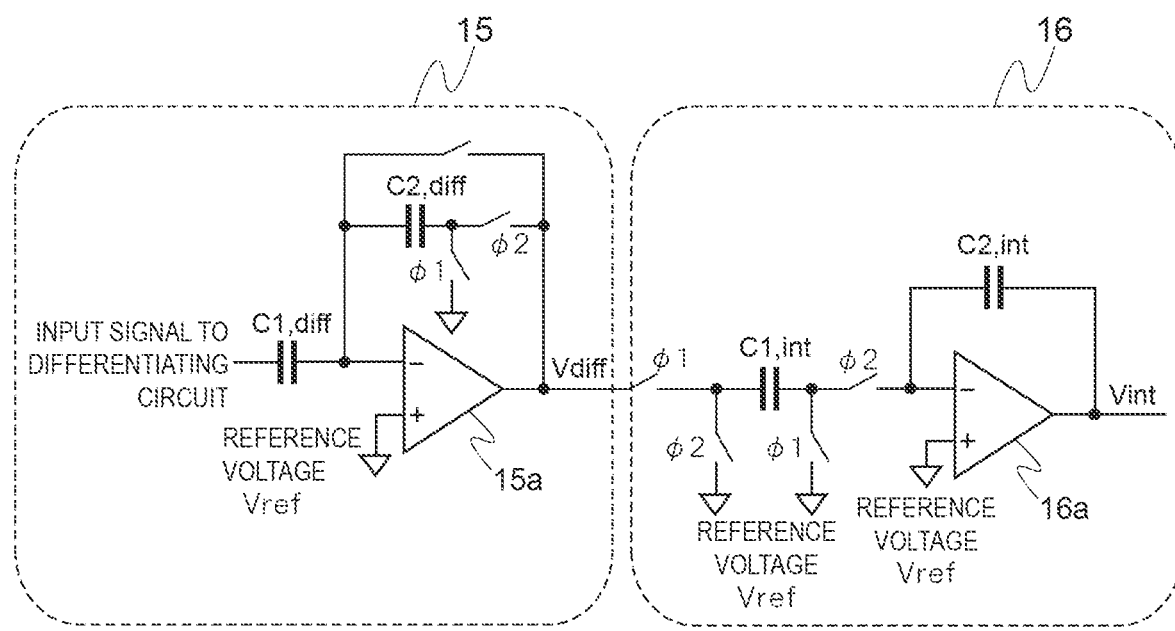
FIG. 10 is a circuit configuration diagram in which a difference calculation circuit and an integrating circuit in the hall electromotive force signal detection circuit according to the present embodiment are implemented with switched capacitor circuits.

FIG. 10 is a circuit configuration diagram in which the difference calculation circuit and the integrating circuit in the hall electromotive force signal detection circuit according to the present embodiment are implemented with switched capacitor circuits. The difference calculation circuit 15 is constituted of an operational amplifier 15a, capacitors C1, diff and C2, diff, and a switch, and calculates a voltage difference between Vout($\phi$1) and Vout($\phi$2) to be sampled sequentially in the capacitor C1, diff at an input side, so as to output Vdiff (see Expression 10).

Further, the integrating circuit 16 is constituted of an operational amplifier 16a, capacitors C1, int and C2, int, and a switch. Vint is calculated by converting Vdiff sampled in the capacitor C1, int at the input side into a charge (C1, int*Vdiff) and transferring the charge to the capacitor C2, int to perform integral calculation (see Expression 11).

Note that the difference calculation circuit 15 and the integrating circuit 16 are switched capacitor circuits.

The difference calculation circuit 15, which is the characteristic configuration of the present embodiment, has a circuit configuration known as Peak-To-Peak circuit, and calculates Vdiff=(C1, diff/C2, diff)×(1 Vout($\phi$1)−Vout($\phi$2)) according to the transfer function Hdiff(z) of the difference calculation circuit, as represented by Expression 10.

Herein, Peak-To-Peak circuit is taken as an example of the difference calculation circuit to make explanation, but there are various configurations of the difference calculation circuits usable herein, as well as the Peak-To-Peak circuit.

[Math. 10]

Transfer Function of Time Discretization Differential Circuit Constituted of Switched Capacitor Circuits  (Expression 10)

$$Hdiff(z) = \left(\frac{C1, diff}{C2, diff}\right)(1 - z^{-1})$$

The output signal Vdiff of the difference calculation circuit 15 in FIG. 10 is integrated by the integrating circuit 16 constituted of the switched capacitor circuits, to obtain voltage signal Vint. In the example of the circuit configuration as illustrated in FIG. 10, the transfer function Hint(z) of the integrating circuit is represented by Expression 11.

[Math. 11]

Transfer Function of Integrating Circuit Constituted of Switched Capacitor Circuits  (Expression 11)

$$H\text{int}(z) = \left(\frac{C1, \text{int}}{C2, \text{int}}\right)\left(\frac{z^{-1}}{1 - z^{-1}}\right)$$

(Circuit Configuration Using AD Converter, Integrator by Digital Circuit, and DA Converter)

Figure 11:
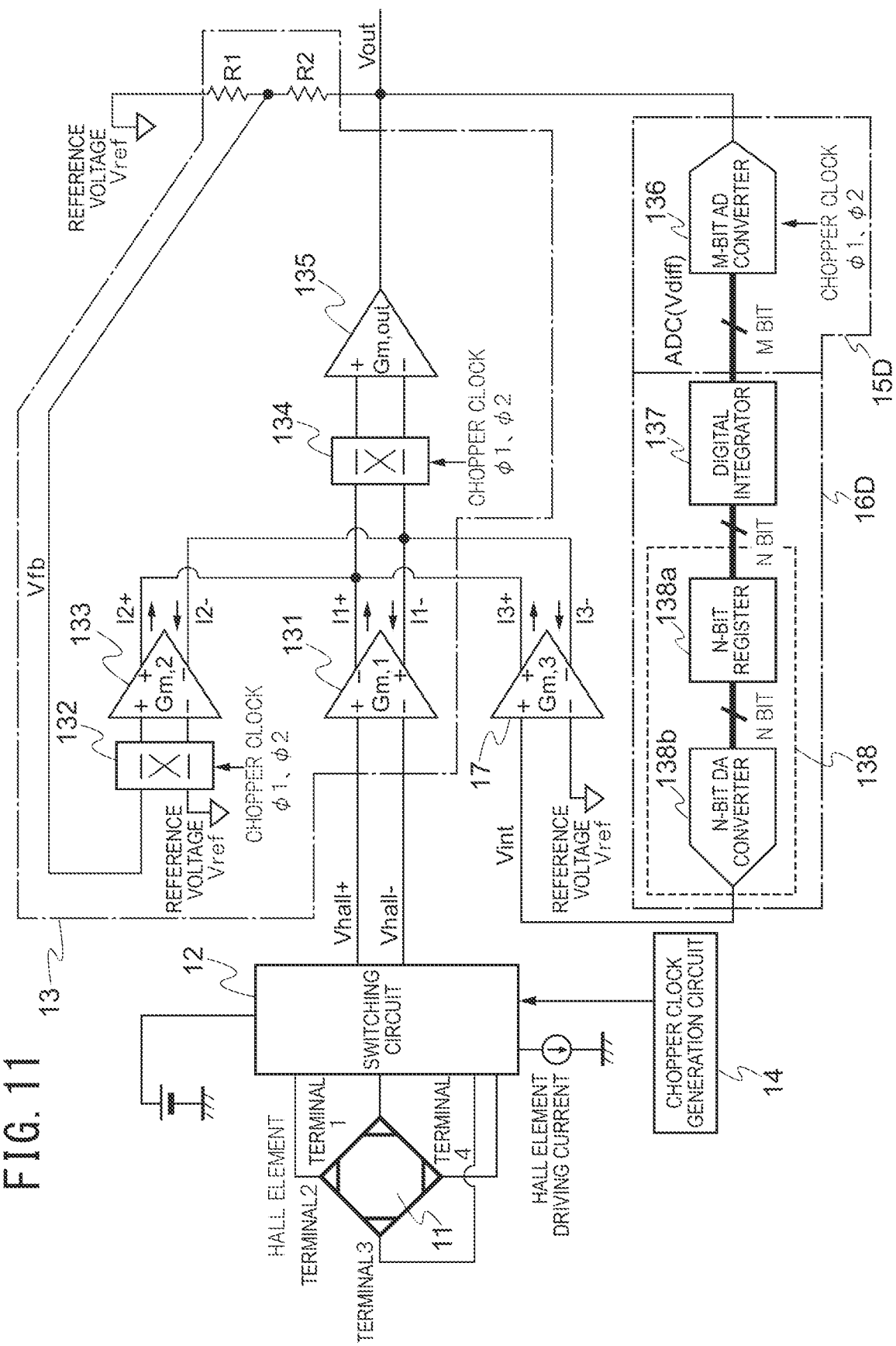
FIG. 11 is a circuit configuration diagram in which the difference calculation circuit and the integrating circuit in the hall electromotive force signal detection circuit according to the present embodiment are implemented with an AD converter, an integrator by use of digital circuit, and a DA converter.

FIG. 11 is a circuit configuration diagram in which the difference calculation circuit and the integrating circuit in the hall electromotive force signal detection circuit according to the present embodiment are implemented with an AD converter, an integrator by use of digital circuits, and a DA converter. In the figure, a reference sign 136 indicates an M-bit AD converter, a reference sign 138 indicates a DA converter, a reference sign 138a indicates an N-bit register, and a reference sign 138b indicates an N-bit DA converter.

A difference calculation circuit 15D is the M-bit AD converter 136, an integrating circuit 16D is constituted of a digital integrator 137, and the DA converter 138 constituted of the N-bit register 138a and the N-bit DA converter 138b.

According to the circuit configuration herein, the difference calculation circuit 15D in the feedback circuit according to the present embodiment is implemented with the AD converter 136, the integrating circuit 16D therein is implemented with a digital circuit constituted of the digital integrator 137 and the DA converter 138, and the output signal of the integrating circuit 16D is converted into an analog signal Vint by use of the DA converter 138b. That is, the difference calculation circuit 15D is constituted of the AD converter 136, the integrating circuit 16D is constituted as the digital circuits 137 and 138, and the voltage fed back to the third transistor differential pair (Gm, 3) 17 is generated by the DA converter 138b.

(Example Using Difference Calculation Circuit Illustrated in FIG. 10 and Integrating Circuit Including ΔΣ-Modulation AD Converter and DA Converter)

Figure 12:
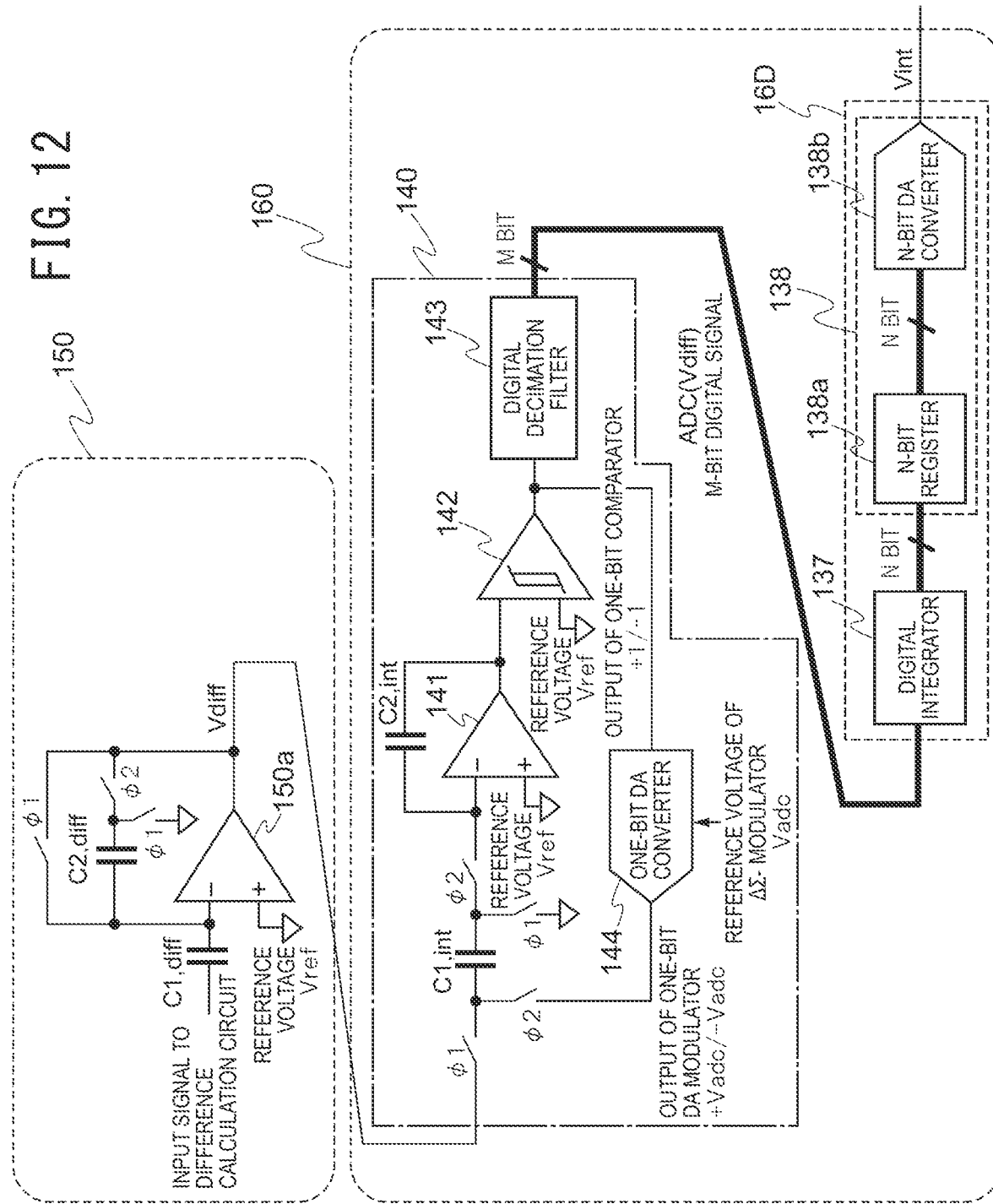
FIG. 12 is a circuit configuration diagram illustrating an example of the difference calculation circuit in the hall electromotive force signal detection circuit according to the present embodiment, and an integrating circuit including an ΔΣ-type AD converter and a DA converter.

FIG. 12 is a circuit configuration diagram illustrating an example using the difference calculation circuit in the hall electromotive force signal detection circuit according to the present embodiment, and an integrating circuit including a ΔΣ-type AD converter and a DA converter. A difference calculation circuit 150 has the same circuit configuration as the difference calculation circuit 15 illustrated in FIG. 10. Note that a reference sign 150a indicates an operational amplifier. Further, an integrating circuit 160 is constituted of an ΔΣ-modulation AD converter 140 and an integrating circuit 16D as illustrated in FIG. 11, the integrating circuit 16D is constituted of a digital integrator 137 and a DA converter 138. The ΔΣ-modulation AD converter 140 is constituted of an integrating circuit 16 as illustrated in FIG. 10, a comparator 142 coupled to an operational amplifier 141 of this integrating circuit 16, a digital decimation filter 143 coupled to this comparator 142, and a one-bit DA converter 144 for feeding back the output of the comparator 142 to the operational amplifier 141 constituting the integrating circuit.

In FIG. 12, similarly to the exemplary circuit configuration of FIG. 10, the operation of time-derivative is performed to get an analog signal Vdiff by the difference calculation circuit (Peak-To-Peak circuit) implemented with switched capacitor circuit on Vout which is the output of the signal amplifier 13. The integrating circuit into which the analog signal Vdiff is input performs AD conversion of the signal Vdiff at an input stage of the integrating circuit, so as to perform integral calculation by digital signal processing.

In FIG. 12, 1st order ΔΣ modulator 140 is used as an AD converter for performing AD conversion of the analog signal Vdiff. A signal that is one-bit quantized by the comparator 142 in this ΔΣ modulator 140 is processed by the decimation filter 143 implemented as digital filter, and the digital signal ADC (Vdiff) of signed M-bit width is obtained as the digitized signal Vdiff. This signed M-bit signal is integrated by the digital-circuit integrator 137, and thus a signal of signed N-bit width is obtained. This signed N-bit signal is stored in the register 138a, and an analog voltage Vint is obtained by use of the N-bit DA converter 138b.

As illustrated in FIG. 12, if an appropriate AD converter and an appropriate DA converter are used, it is possible to constitute the feedback circuit of the present embodiment so as to include digital circuits.

In the feedback circuit of the present embodiment, it is necessary to keep track of the time variation of the offset voltage of the hall element and the offset voltages of the transistor differential pairs. However, the time variation of the offset voltages that should be tracked herein is very slow, and therefore, an AD converter with a high-speed operation is not required for the AD converter. Consequently, as in the case of the exemplary 1st order ΔΣ modulator illustrated in FIG. 12, it is possible to use a low-order ΔΣ modulator with a small circuit scale.

(Example Using Difference Calculation Circuit Including Double-Integral AD Converter Including Integrating Circuit Illustrated in FIG. 10 and Integrating Circuit Including DA Converter)

As described above, the feedback loop that suppresses the occurrence of ripples is intended to cancel a DC offset, and therefore becomes a loop with extremely narrow bandwidth. In view of this, it is also possible to use an AD converter known as double-integral type, as the AD converter. The double-integral AD converter is a type that is generally used in low-speed and high-accuracy measurement such as digital multimeter, and in the present embodiment, it is one of extremely preferable types of AD conversion as a type of the AD converter constituting the above-mentioned feedback.

Figure 13:
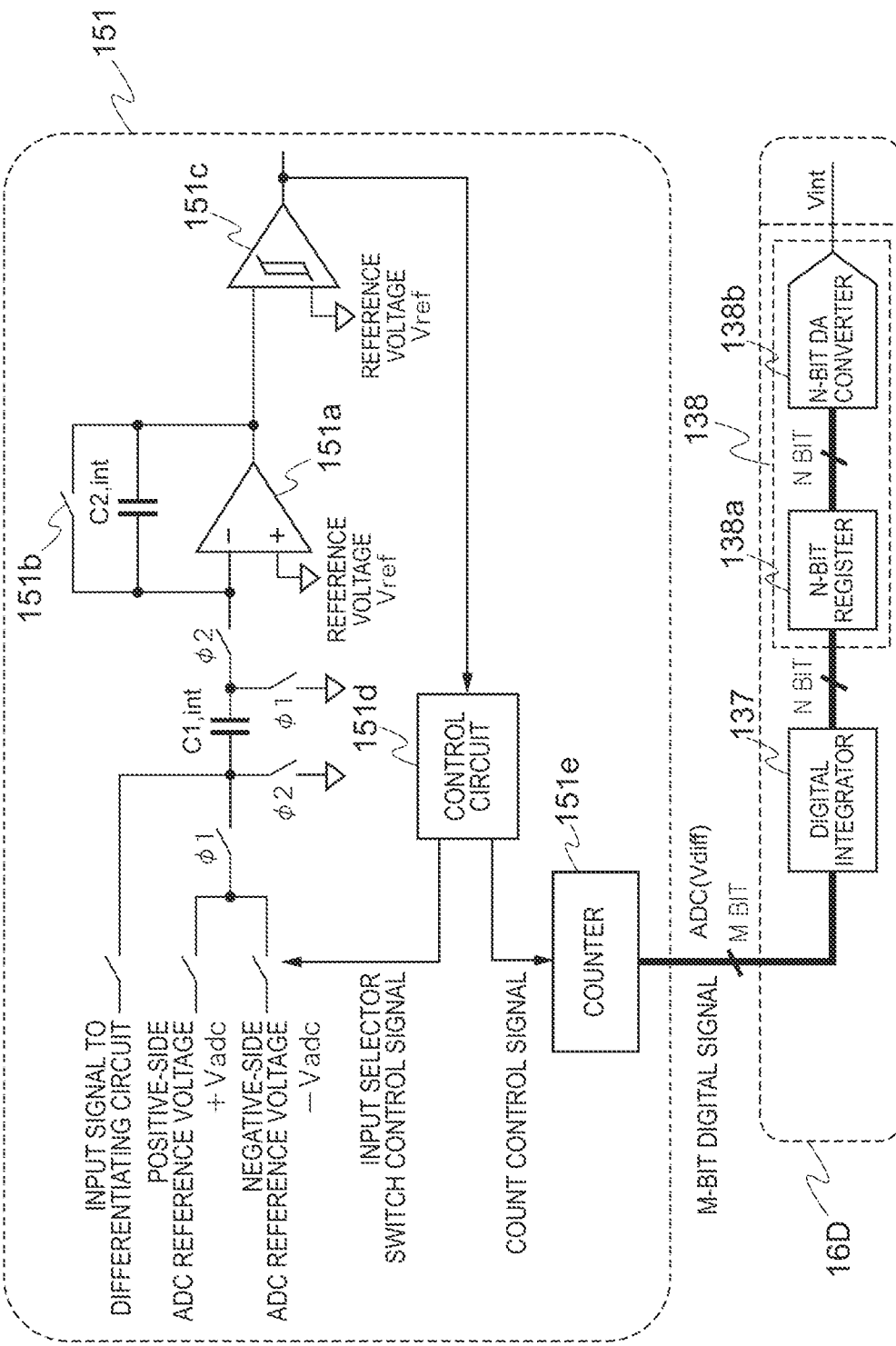
FIG. 13 is a circuit configuration diagram illustrating an example using a double-integral AD converter, as the difference calculation circuit in the hall electromotive force signal detection circuit according to the present embodiment, and an integrating circuit including a DA converter.

FIG. 13 is a circuit configuration diagram illustrating an example of the hall electromotive force signal detection circuit according to the present embodiment by use of an difference calculation circuit constituted of a double-integral AD converter and a DA converter. In the figure, a reference sign 151 indicates a double-integral AD converter, a reference sign 151a indicates an operational amplifier, a reference sign 151b indicates an integration reset switch, a reference sign 151c indicates a comparator, a reference sign 151d indicates a control circuit, and a reference sign 151e indicates a counter.

The double-integral AD converter 151 has the circuit configuration including the difference calculation circuit 15 shown in FIG. 10, and is constituted of the comparator 151c coupled to the operational amplifier 151a, the control circuit 151d coupled to the comparator 151c, and the counter 151e coupled to the control circuit 151d. Further, an integrating circuit 16D has a circuit configuration similar to the integrating circuit illustrated in FIG. 11, and is constituted of a digital integrator 137 and a DA converter 138. The DA converter 138 is constituted of an N-bit register 138a and an N-bit DA converter 138b coupled to this N-bit register 138a.

In FIG. 13, since it is possible to integrate a difference signal between Vout(φ1) and Vout(φ2), a differential operation is performed in an AD conversion operation by use of the double-integral AD converter, obtaining ADC (Vdiff) as a digitized signal.

Figure 14:
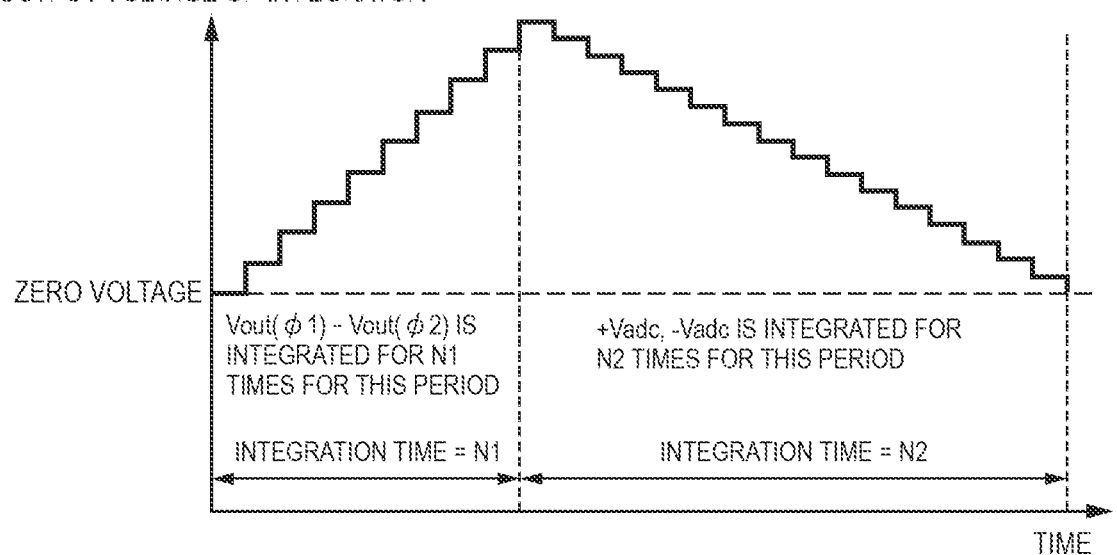
FIG. 14 illustrates the operation of the double-integral AD converter.

An AD conversion operation of the double-integral AD converter 151 will be described below, with reference to FIG. 14. After AD conversion is started, the integration reset switch 151b is released in the integrator, so as to integrate Vout(φ1)−Vout(φ2) for predetermined N1 times. Then, an input selector switch control signal changes an input voltage to the integrator to +Vadc or to −Vadc according to the polarity of the output voltage of the operational amplifier 151a of the integrator, the output voltage being detected by the comparator 151c. And the integration operation of the integrator is started again. Here, the polarity of the output voltage of the integrator is monitored by the comparator 151c, and integration is performed for N2 times so that the output voltage of the integrator becomes zero. The number of counts N2 of the counter 151e obtained through the control circuit 151d is the AD conversion result of the double integral technique. That is, ADC (Vdiff)=N2 is obtained. The transfer function of the AD conversion using this double-integral AD converter 151 is represented by Expression 12 where Vout(φ1) and Vout(φ2) sampled at an i time are assumed Vout(φ1) (i) and Vout(φ2) (i), respectively.

[Math. 12]

AD Conversion by Double-integral AD Converter     Expression 12

$$\sum_{i=1}^{N1}\{Vout(\phi1)(i) - Vout(\phi2)(i)\} = N2 \times (\pm Vadc)$$

The AD conversion result N2 obtained by the double-integral AD converter 151 is the result obtained by performing AD conversion on Vout(φ1)−Vout(φ2). This digital signal N2 is integrated by the digital integrator 137, and then converted into an analog signal Vint by use of the DA converter 138b.

Here, in the case of the double-integral AD converter 151, the bandwidth of the above-mentioned feedback can be controlled by variably controlling the integration count N1. That is, in an initial pull-in operation, the value of N1 is set to be a small value so as to reduce the pull-in time of the feedback, while the value of N1 is increased in the steady operation after the initial pull-in operation is completed, thereby making it possible to realize the robustness in which the feedback loop does not malfunction by disturbance noise.

FIG. 15 is a circuit configuration diagram illustrating an example of a feedback circuit different from the feedback circuit of the hall electromotive force signal detecting apparatus according to the present embodiment as illustrated in FIG. 7. Note that a reference sign 18 indicates a fourth transconductance element. The feedback circuit configuration illustrated in FIG. 15 does not perform feedback from the output signal Vout of the signal amplifier circuit 13, but feedback from the input node of the output stage (Gm, out) 135.

That is, it is also possible to provide the fourth transconductance element 18 between the output of the third switching circuit 134 and the difference calculation circuit 15 so as to perform feedback. An advantage of this feedback circuit configuration is that the feedback circuit for cancelling ripples is insusceptible to the fluctuation of the load seen from the output in FIG. 15. However, in the current sensor, the subsequent stage of FIG. 15 is an output buffer circuit prepared separately, and therefore, such load fluctuation is unlikely to occur. A disadvantage of the feedback circuit configuration of FIG. 15 is that the fourth transconductance element (transistor differential pair, Gm, 4) is additionally required.

As stated above, the hall electromotive force signal detection circuit according to the present embodiment includes a feedback circuit for canceling a DC offset component to cause ripple-shaped noise in the output voltage signal of a signal amplifier circuit. In view of this, it is possible to realize highly accurate magnetic field detection by dynamic offset cancellation means (a spinning current method and a chopper amplifier) for modulating an offset voltage of a hall element and an offset voltage of a signal amplifier circuit, by use of a chopper clock. Further, in comparison with a circuit configuration (e.g., see Patent Document 4) in which filters for reducing ripple-shaped noise are additionally placed, it is possible to achieve fast response as a magnetic sensor, and further, there is an advantage that no noise increase occurs due to the filters thus additionally placed. Further, the above-mentioned hall electromotive force signal detection circuit of the present embodiment is usable as a current sensor.

REFERENCE SIGNS LIST

1, 11: Hall Element
2, 12: First Switching Circuit
3, 13: Signal Amplifier Circuit
4, 14: Chopper Clock Generation Circuit
15: Difference Calculation Circuit in Discrete-time (Time Discretization Difference Circuit)
15a, 16a: Operational Amplifier
16: Integrating Circuit
16a: Operational Amplifier
17: Third Transconductance Element
18: Fourth Transconductance Element
31, 131: First Transconductance Element
32, 132: Second Switching Circuit
33, 133: Second Transconductance Element
34, 134: Third Switching Circuit
35, 135: Output Stage of Signal Amplifier Circuit
36: Operational Amplifier
136: M-bit AD Converter
138: DA Converter
138a: N-bit Register
138b: N-bit DA Converter
150: Time Discretization Difference Circuit
150a, 151a: Operational Amplifier
151: Double-integral AD Converter
151b: Integration Reset Switch
151c: Comparator
151d: Control Circuit
151e: Counter

What is claimed is:

1. A signal detection circuit, comprising:
a magnetic sensor element configured to generate a signal that includes a magnetic signal and an offset signal component;
a signal amplifier circuit configured to amplify the signal generated by the magnetic sensor and configured to output a first output signal having the magnetic signal and the offset signal component; and
a feedback circuit configured to generate a feedback signal indicating a ripple component based on the offset signal component in the first output signal by performing time derivative of the first output signal, and configured to output the generated feedback signal to the signal amplifier circuit,
wherein the signal amplifier circuit comprises:
a first switching circuit configured to demodulate the signal generated by the magnetic sensor based on a primary current and configured to generate the first output signal;
a pair of resistors connected in series and configured to perform voltage-division on a component included in the first output signal at a predetermined ratio to generate a divided voltage;
a second switching circuit directly connected to the pair of the resistors and configured to generate an output voltage; and
a transconductance element configured to convert the output voltage from the second switching circuit into a current and configured to output the current to the first switching circuit by adding the current to the primary current.

2. The signal detection circuit according to claim 1, wherein the feedback circuit is configured to generate the feedback signal by calculating the difference signal by determining a variation of the first output signal between two discrete times separated by a certain time period.

3. The signal detection circuit according to claim 1, wherein the feedback circuit is configured to generate the feedback signal by performing time integration after performing the time derivative of the first output signal.

4. The signal detection circuit according to claim 1, wherein the signal amplifier circuit is configured to generate the ripple component by modulating the offset signal component.

5. The signal detection circuit according to claim 1, wherein the feedback circuit comprises a transconductance element configured to convert the feedback signal into a second current, and configured to output the second current to the signal amplifier circuit.

6. A signal detection circuit, comprising:
- a magnetic sensor element configured to generate a signal that includes a magnetic signal and an offset signal component;
- a signal amplifier circuit configured to amplify the signal generated by the magnetic sensor and configured to output a first output signal having the magnetic signal and the offset signal component;
- a feedback circuit configured to generate a feedback signal indicating a ripple component based on the offset signal component in the first output signal by performing time derivative of the first output signal, and configured to output the generated feedback signal to the signal amplifier circuit, wherein the signal amplifier circuit comprises:
- a first switching circuit configured to demodulate the signal generated by the magnetic sensor based on a primary current and configured to generate the first output signal;
- a pair of resistors connected in series and configured to perform voltage-division on a component included in the first output signal at a predetermined ratio to generate a divided voltage;
- a second switching circuit directly connected to the pair of the resistors and configured to generate an output voltage; and
- a first transconductance element configured to convert the output voltage from the second switching circuit into a first current and configured to output the first current to the first switching circuit by adding the current to the primary current;

wherein the feedback circuit comprises a second transconductance element configured to convert the feedback signal into a second current, and configured to output the second current to the first switching circuit by adding the second current to the primary current.

* * * * *